United States Patent
Ogihara et al.

(10) Patent No.: US 8,652,750 B2
(45) Date of Patent: *Feb. 18, 2014

(54) SILICON-CONTAINING FILM-FORMING COMPOSITION, SILICON-CONTAINING FILM, SILICON-CONTAINING FILM-BEARING SUBSTRATE, AND PATTERNING METHOD

(75) Inventors: Tsutomu Ogihara, Joetsu (JP); Toshiharu Yano, Joetsu (JP); Koji Hasegawa, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 950 days.

This patent is subject to a terminal disclaimer.

(21) Appl. No.: 12/163,795

(22) Filed: Jun. 27, 2008

(65) Prior Publication Data

US 2009/0011372 A1     Jan. 8, 2009

(30) Foreign Application Priority Data

Jul. 4, 2007 (JP) ................. 2007-175956
Sep. 21, 2007 (JP) ................. 2007-245832

(51) Int. Cl.
G03F 7/09 (2006.01)
G03F 7/20 (2006.01)
G03F 7/30 (2006.01)
G03F 7/36 (2006.01)
G03F 7/039 (2006.01)

(52) U.S. Cl.
USPC .............. 430/270.1; 430/272.1; 430/311; 430/313; 430/317; 430/318; 430/323; 430/325; 430/326

(58) Field of Classification Search
None
See application file for complete search history.

(56) References Cited

U.S. PATENT DOCUMENTS

| | | | |
|---|---|---|---|
| 5,385,804 A | 1/1995 | Premlatha et al. | |
| 5,632,910 A | 5/1997 | Nagayama et al. | |
| 6,013,416 A | 1/2000 | Nozaki et al. | |
| 6,025,117 A | 2/2000 | Nakano et al. | |
| 6,280,898 B1 | 8/2001 | Hasegawa et al. | |
| 6,329,125 B2 | 12/2001 | Takechi et al. | |
| 6,503,692 B2 | 1/2003 | Angelopoulos et al. | |
| 6,703,183 B2 | 3/2004 | Nishi et al. | |
| 7,303,785 B2 | 12/2007 | Ogihara et al. | |
| 7,303,855 B2 | 12/2007 | Hatakeyama et al. | |
| 8,026,038 B2 * | 9/2011 | Ogihara et al. | 430/270.1 |
| 8,029,974 B2 * | 10/2011 | Ogihara et al. | 430/270.1 |
| 2001/0026901 A1 | 10/2001 | Maeda et al. | |
| 2002/0187422 A1 | 12/2002 | Angelopoulos et al. | |
| 2003/0091929 A1 | 5/2003 | Nishi et al. | |
| 2004/0247900 A1 | 12/2004 | Ogihara et al. | |
| 2004/0253461 A1 | 12/2004 | Ogihara et al. | |
| 2005/0106499 A1 | 5/2005 | Harada et al. | |
| 2006/0019195 A1 | 1/2006 | Hatakeyama et al. | |
| 2007/0134916 A1 | 6/2007 | Iwabuchi et al. | |
| 2008/0026322 A1 * | 1/2008 | Ogihara et al. | 430/270.1 |
| 2009/0136869 A1 | 5/2009 | Ogihara et al. | |

FOREIGN PATENT DOCUMENTS

| | | |
|---|---|---|
| EP | 1 375 615 A2 | 1/2004 |
| EP | 1 788 433 A2 | 5/2007 |
| EP | 1 845 132 A2 | 10/2007 |
| EP | 1 867 681 A1 | 12/2007 |
| EP | 2 011 829 A1 | 1/2009 |
| EP | 2 063 319 A1 | 5/2009 |
| JP | 5-291208 A | 11/1993 |
| JP | 6-95385 A | 4/1994 |
| JP | 7-181688 A | 7/1995 |
| JP | 7-183194 A | 7/1995 |
| JP | 8-12626 A | 1/1996 |
| JP | 9-73173 A | 3/1997 |
| JP | 11-60735 A | 3/1999 |
| JP | 2000-159758 A | 6/2000 |
| JP | 2003-84438 A | 3/2003 |
| JP | 2004-153125 A | 5/2004 |
| JP | 2004-157469 A | 6/2004 |
| JP | 2004-191386 A | 7/2004 |
| JP | 2004-349572 A | 12/2004 |
| JP | 2005-15779 A | 1/2005 |
| JP | 2005-128509 A | 5/2005 |
| JP | 2005-146252 A | 6/2005 |
| JP | 2005-520354 A | 7/2005 |
| WO | WO-00/01684 A1 | 1/2000 |

OTHER PUBLICATIONS

Hikaru Sugita et al., J. Appl. polym. Sci., vol. 88, pp. 636-640 (2003).
C. J. Brinker and G. W. Scherer, "Sol-Gel Science: The Physics and Chemistry of Sol-Gel Processing", Academic Press, San Diego, pp. 138-143, (1990).
Hiroshi Ito et al., Polym. Mater. Sci. Eng., 1997, 77, p. 449-450.
Extended European Search Report issued on Jan. 28, 2010 in European Patent Application No. 09012329.0.
Extended European Search Report issued on Jan. 29, 2010 in European Patent Application No. 09012327.4.

* cited by examiner

*Primary Examiner* — Sin J. Lee
(74) *Attorney, Agent, or Firm* — Birch, Stewart, Kolasch & Birch, LLP

(57) ABSTRACT

A silicon-containing film is formed from a heat curable composition comprising (A) a silicon-containing compound obtained through hydrolytic condensation of a hydrolyzable silicon compound in the presence of an acid catalyst, (B) a hydroxide or organic acid salt of Li, Na, K, Rb or Ce, or a sulfonium, iodonium or ammonium compound, (C) an organic acid, (D) a cyclic ether-substituted alcohol, and (E) an organic solvent. The silicon-containing film ensures effective pattern formation, effective transfer of a photoresist pattern, and accurate processing of a substrate.

15 Claims, No Drawings

SILICON-CONTAINING FILM-FORMING COMPOSITION, SILICON-CONTAINING FILM, SILICON-CONTAINING FILM-BEARING SUBSTRATE, AND PATTERNING METHOD

CROSS-REFERENCE TO RELATED APPLICATION

This non-provisional application claims priority under 35 U.S.C. §119(a) on Patent Application Nos. 2007-175956 and 2007-245832 filed in Japan on Jul. 4, 2007 and Sep. 21, 2007, respectively, the entire contents of which are hereby incorporated by reference.

TECHNICAL FIELD

This invention relates to a silicon-containing film-forming composition suitable for forming a silicon-containing film for use as an intermediate layer in a multilayer resist process which is used in micropatterning in the manufacturing process of semiconductor devices and the like, especially for forming such a silicon-containing film by spin coating; a silicon-containing film formed therefrom; a silicon-containing film-bearing substrate; and a patterning method using the same.

BACKGROUND ART

In the drive for higher integration and operating speeds in LSI devices, the pattern feature size is made drastically finer. Under the miniaturizing trend, the lithography has achieved formation of finer patterns by using a light source with a shorter wavelength and by a choice of a proper resist composition for the shorter wavelength. Predominant among others are positive photoresist compositions which are used as a single layer. These single-layer positive photoresist compositions are based on resins possessing a framework having resistance to dry etching with chlorine or fluorine gas plasma and provided with a resist mechanism that exposed areas become dissolvable. Typically, the resist composition is coated on a substrate to be processed (referred to as "processable substrate," hereinafter) and exposed to a pattern of light, after which the exposed areas of the resist coating are dissolved to form a pattern. Then, the substrate can be processed by dry etching with the remaining resist pattern serving as an etching mask.

In an attempt to achieve a finer feature size, i.e., to reduce the pattern width with the thickness of a photoresist coating kept unchanged, the photoresist coating becomes low in resolution performance. If the photoresist coating is developed with a liquid developer to form a pattern, the so-called "aspect ratio" (depth/width) of the resist pattern becomes too high, resulting in pattern collapse. For this reason, the miniaturization is accompanied by a thickness reduction of the photoresist coating (thinner coating).

On the other hand, a method commonly used for the processing of a processable substrate is by processing a substrate by dry etching with the patterned photoresist film made an etching mask. Since a dry etching method capable of establishing a full etching selectivity between the photoresist film and the processable substrate is not available in practice, the resist film is also damaged during substrate processing. That is, the resist film breaks down during substrate processing, failing to transfer the resist pattern to the processable substrate faithfully. As the pattern feature size is reduced, resist materials are required to have higher resistance to dry etching.

With the progress of the exposure wavelength toward a shorter wavelength, the resin in resist compositions is required to have less light absorption at the exposure wavelength. In response to changes from i-line to KrF and to ArF, the resin has made a transition to novolac resins, polyhydroxystyrene and aliphatic polycyclic skeleton resins. Actually, the etching rate under the above-indicated dry etching conditions has been accelerated. Advanced photoresist compositions featuring a high resolution tend to be rather low in etching resistance. This suggests the inevitableness that a processable substrate is dry etched through a thinner photoresist coating having weaker etching resistance. It is urgently required to have the material and process suited in this processing stage.

One solution to these problems is a multilayer resist process. The process involves forming an intermediate film on a processable substrate, forming a photoresist film (resist overcoat film) thereon, wherein the intermediate film with different etching selectivity from the resist overcoat film intervenes between the resist overcoat film and the processable substrate, patterning the resist overcoat film, dry etching the intermediate film through the overcoat resist pattern as an etching mask for thereby transferring the pattern to the intermediate film, and dry etching the processable substrate through the intermediate film pattern as an etching mask for thereby transferring the pattern to the processable substrate.

Included in the multilayer resist process is a bi-layer resist process. One exemplary bilayer resist process uses a silicon-containing resin as the overcoat resist material and a novolac resin as the intermediate film (e.g., JP-A 6-95385). The silicon resin exhibits good resistance to reactive dry etching with an oxygen plasma, but is readily etched away with a fluorine gas plasma. On the other hand, the novolac resin is readily etched away by reactive dry etching with an oxygen gas plasma, but exhibits good resistance to dry etching with fluorine and chlorine gas plasmas. Thus, a novolac resin film is formed on a processable substrate as a resist intermediate film, and a silicon-containing resin is coated thereon as a resist overcoat film. Subsequently, the silicon-containing resist film is patterned by exposure to energy radiation and post-treatments including development. While the patterned silicon-containing resist film serves as an etching mask, reactive dry etching with an oxygen plasma is carried out for etching away a portion of the novolac resin where the resist pattern has been removed, thereby transferring the pattern to the novolac film. While the pattern transferred to the novolac film serves as an etching mask, the processable substrate is etched with a fluorine or chlorine gas plasma for transferring the pattern to the processable substrate.

In the pattern transfer by dry etching, a transfer pattern having a relatively good profile is obtained if the etching mask has a satisfactory etching resistance. Since problems like pattern collapse caused by such factors as friction by a developer during resist development are unlikely to occur, a pattern having a relatively high aspect ratio is produced. Therefore, even though a fine pattern could not be formed directly from a resist film of novolac resin having a thickness corresponding to the thickness of an intermediate film because of pattern collapse during development due to the aspect ratio problem, the use of the bi-layer resist process enables to produce a fine pattern of novolac resin having a sufficient thickness to serve as a mask for dry etching of the processable substrate.

Also included in the multilayer resist process is a tri-layer resist process which can use general resist compositions as used in the single-layer resist process. In the tri-layer resist process, for example, an organic film of novolac resin or the like is formed on a processable substrate as a resist undercoat film, a silicon-containing film is formed thereon as a resist intermediate film, and an ordinary organic photoresist film is formed thereon as a resist overcoat film. On dry etching with a fluorine gas plasma, the resist overcoat film of organic nature provides a satisfactory etching selectivity ratio relative to the silicon-containing resist intermediate film. Then, the resist pattern is transferred to the silicon-containing resist intermediate film by dry etching with a fluorine gas plasma. With this process, even on use of a resist composition which is difficult to form a pattern having a sufficient thickness to allow for direct processing of a processable substrate, or a resist composition which has insufficient dry etching resistance to allow for substrate processing, a pattern of novolac film having sufficient dry etching resistance to allow for substrate processing is obtainable like the bilayer resist process, as long as the pattern can be transferred to the silicon-containing film.

The silicon-containing resist intermediate films used in the tri-layer resist process described above include silicon-containing inorganic films deposited by CVD, such as $SiO_2$ films (e.g., JP-A 7-183194) and SiON films (e.g., JP-A 7-181688); and films formed by spin coating, such as spin-on-glass (SOG) films (e.g., JP-A 5-291208, J. Appl. Polym. Sci., Vol. 88, 636-640 (2003)) and crosslinkable silsesquioxane films (e.g., JP-A 2005-520354). Polysilane films (e.g., JP-A 11-60735) would also be useful. Of these, the $SiO_2$ and SiON films have a good function as a dry etching mask during dry etching of an underlying organic film, but require a special equipment for their deposition. By contrast, the SOG films, crosslinkable silsesquioxane films and polysilane films are believed high in process efficiency because they can be formed simply by spin coating and heating.

The applicable range of the multilayer resist process is not restricted to the attempt of increasing the maximum resolution of resist film. For example, in a via-first method which is one of substrate processing methods where an intermediate substrate to be processed has large steps, an attempt to form a pattern with a single resist film encounters problems like inaccurate focusing during resist exposure because of a substantial difference in resist film thickness. In such a case, steps are buried by a sacrificial film for flattening, after which a resist film is formed thereon and patterned. This situation entails inevitable use of the multilayer resist process mentioned above (e.g., JP-A 2004-349572).

While silicon-containing films are conventionally used in the multilayer resist process, they suffer from several problems. For example, as is well known in the art, where an attempt is made to form a resist pattern by photolithography, exposure light is reflected by the substrate and interferes with the incident light, incurring the problem of so-called standing waves. To produce a microscopic pattern of a resist film without edge roughness, an antireflective coating (ARC) must be provided as an intermediate layer. Reflection control is essential particularly under high-NA exposure conditions of the advanced lithography.

In the multilayer resist process, especially the process of forming a silicon-containing film as an intermediate layer by CVD, it becomes necessary for reflection control purposes to provide an organic antireflective coating between the resist overcoat film and the silicon-containing intermediate film. However, the provision of the organic ARC entails the necessity that the organic ARC be patterned with the resist overcoat film made a dry etching mask. That is, the organic ARC is dry etched with the resist overcoat film made a dry etching mask, after which the process proceeds to processing of the silicon-containing intermediate layer. Then the overcoat photoresist must bear an additional load of dry etching corresponding to the processing of the ARC. While photoresist films used in the advanced lithography become thinner, this dry etching load is not negligible. Therefore, greater attention is paid to the tri-layer resist process in which a light-absorbing silicon-containing film not creating such an etching load is applied as an intermediate film.

Known light-absorbing silicon-containing intermediate films include light-absorbing silicon-containing films of spin coating type. For example, JP-A 2005-15779 discloses the provision of an aromatic structure as the light-absorbing structure. Since the aromatic ring structure capable of effective light absorption acts to reduce the rate of dry etching with a fluorine gas plasma, this approach is disadvantageous for the purpose of dry etching the intermediate film without an additional load to the photoresist film. Since it is thus undesirable to incorporate a large amount of such light-absorbing substituent groups, the amount of incorporation must be limited to the minimum.

Further, the dry etching rate of the resist undercoat film during reactive dry etching with an oxygen gas plasma as commonly used in the processing of the resist undercoat film with the intermediate film made a dry etching mask is preferably low so as to increase the etching selectivity ratio between the intermediate film and the undercoat film. To this end, the intermediate film is desired to have a higher content of silicon which is highly reactive with fluorine etchant gas. The requirement arising from the conditions of processing both the overcoat or photoresist film and the undercoat or organic film gives preference to an intermediate film having a higher content of silicon which is highly reactive with fluorine gas.

In actual silicon-containing intermediate film-forming compositions of spin coating type, however, organic substituent groups are incorporated into the silicon-containing compounds so that the silicon-containing compounds may be dissolvable in organic solvents. Of the silicon-containing intermediate films known in the art, an SOG film-forming composition adapted for KrF excimer laser lithography is disclosed in J. Appl. Polym. Sci., Vol. 88, 636-640 (2003). However, since light-absorbing groups are described nowhere, it is believed that this composition forms a silicon-containing film without an antireflective function. This film fails to hold down reflection during exposure by the lithography using the advanced high-NA exposure system. It would be impossible to produce microscopic pattern features.

In addition to the dry etching properties and antireflection effect, the composition for forming an intermediate film with a high silicon content suffers from several problems, of which shelf stability is most outstanding. The shelf stability relates to the phenomenon that a composition comprising a silicon-containing compound changes its molecular weight during shelf storage as a result of condensation of silanol groups on the silicon-containing compound. Such molecular weight changes show up as film thickness variations and lithography performance variations. In particular, the lithography performance is sensitive, and so, even when the condensation of silanol groups within the molecule takes place merely to such an extent that it does not show up as a film thickness buildup or molecular weight change, it can be observed as variations of microscopic pattern features.

As is known in the art, such highly reactive silanol groups can be rendered relatively stable if they are kept in acidic conditions. See C. J. Brinker and G. W. Scherer, "Sol-Gel Science: The Physics and Chemistry of Sol-Gel Processing," Academic Press, San Diego (1990). Further, addition of water improves the shelf stability as disclosed in J. Appl. Polym. Sci., Vol. 88, 636-640 (2003), JP-A 2004-157469 and JP-A 2004-191386. However, the silicon-containing compounds prepared by the methods of these patent publications are not inhibited completely from condensation reaction of silanol groups even when any of these means is taken. The silicon-containing compound in the composition slowly alters with the passage of time, and a silicon-containing film formed from such an altered composition changes in nature. Then the composition must be held in a refrigerated or frozen state just until use, and on use, be brought back to the service temperature (typically 23° C.) and be consumed quickly.

DISCLOSURE OF THE INVENTION

The present invention relates to a process involving the steps of disposing a silicon-containing film on an organic film, disposing a photoresist film thereon, and forming a resist pattern. An object of the present invention is to provide a silicon-containing film-forming composition in which (1) the silicon-containing film has a light-absorbing capability to allow for pattern formation even under high-NA exposure conditions, (2) the silicon-containing film serves as a satisfactory dry etching mask between the overlying layer or photoresist film and the underlying layer or organic film, and (3) the composition is fully shelf stable. Another object is to provide a substrate having the silicon-containing film formed thereon, and a patterning method.

Making investigations on the lithographic properties and stability of a silicon-containing intermediate film-forming composition, the inventors have found that a composition is obtained by combining (A) a silicon-containing compound obtained through hydrolytic condensation of a hydrolyzable silicon compound in the presence of an acid catalyst with components (B), (C), (D) and (E) defined below; and that (1) a silicon-containing film formed from the composition holds down reflection under high-NA exposure conditions of either dry or immersion lithography technique when light-absorbing groups are incorporated in the silicon-containing compound, (2) the silicon-containing film has a sufficient etching selectivity ratio to serve as a dry etching mask, and (3) the composition is fully shelf stable so that its lithography performance undergoes little or no change over time.

In a first aspect, the invention provides a heat curable silicon-containing film-forming composition comprising (A) a silicon-containing compound obtained through hydrolytic condensation of a hydrolyzable silicon compound in the presence of an acid catalyst, (B) at least one compound having the general formula (1) or (2):

(1)

wherein L is lithium, sodium, potassium, rubidium or cesium, X is a hydroxyl group or a mono or polyfunctional organic acid residue of 1 to 30 carbon atoms, "a" is an integer of at least 1, "b" is 0 or an integer of at least 1, and a+b is equal to the valence of hydroxyl group or organic acid residue,

(2)

wherein M is sulfonium, iodonium or ammonium, A is X or a non-nucleophilic counter ion, "a" and "b" are as defined above, and a+b is equal to the valence of hydroxyl group, organic acid residue or non-nucleophilic counter ion, (C) a mono or polyfunctional organic acid of 1 to 30 carbon atoms, (D) a mono or polyhydric alcohol substituted with a cyclic ether, and (E) an organic solvent.

In general, when a hydrolyzable silicon compound (often referred to as "monomer") is contacted with water in the presence of an acid catalyst, a hydrolyzable substituent group attached to a silicon atom undergoes hydrolysis to form a silanol group. This silanol group further undergoes condensation reaction with another silanol group or unreacted hydrolyzable group, to form a siloxane bond. This reaction occurs repeatedly and consecutively, forming a silicon-containing compound which is referred to as an oligomer or polymer or sometimes sol. At this point, among silanol groups produced by hydrolytic reaction in the system and available from the monomer, oligomer or polymer, condensation reaction takes place from the highest reactivity groups consecutively to lower reactivity groups, whereupon silanol groups belonging to the monomer, oligomer and polymer are consumed, and a silicon-containing compound forms instead. This condensation reaction proceeds infinitely and sometimes until the silicon-containing compound solution has eventually gelled.

However, this condensation reaction is restrained at a specific pH, as reported in C. J. Brinker and G. W. Scherer, "Sol-Gel Science: The Physics and Chemistry of Sol-Gel Processing," Academic Press, San Diego (1990). It is described in J. Appl. Polym. Sci., Vol. 88, 636-640 (2003) that the reaction system is stabilized around pH 1.5, which pH is referred to as "stable pH," hereinafter.

It has been found that the composition is improved in shelf stability when it is controlled at a stable pH with component (C).

Making further investigations on the silicon-containing compound to inhibit condensation between residual silanol groups in the silicon-containing compound near room temperature, the inventors have found that a mono or polyhydric alcohol substituted with a cyclic ether is effective as a stabilizer for inhibiting condensation near room temperature whereby the composition is outstandingly improved in shelf stability.

Prior art silicon-containing compounds are cured with the aid of a high temperature of above 300° C. or an acid catalyst derived from a thermal acid generator. According to the invention, when the composition is coated and heat cured, component (B) acts to alter the pH in proximity to silanol groups from the stable pH region to an unstable pH region (approximately pH 3, see C. J. Brinker and G. W. Scherer, "Sol-Gel Science: The Physics and Chemistry of Sol-Gel Processing," Academic Press, San Diego (1990)), so that the film can be effectively cured. If heat cured under the same conditions as the prior art temperature conditions, the composition forms a dense film having an increased degree of crosslinking as compared with the prior art cured films. The migration of effective ingredients in the resist film to the silicon-containing film is prevented, and lithographic properties equivalent to ordinary organic ARC are available.

A technical combination of pH control, stabilizer and crosslinking catalyst in the above-mentioned way provides a composition which remains stable at room temperature and is effectively curable at elevated temperature. The composition can form a silicon-containing antireflective coating which has stability equivalent to conventional organic ARCs.

In a preferred embodiment, the silicon-containing compound (A) comprises a silicon-containing compound obtained by effecting hydrolytic condensation of a hydrolyzable silicon compound in the presence of an acid catalyst which is selected from mineral acids, sulfonic acid derivatives and mixtures thereof to form a reaction mixture containing the silicon-containing compound, and substantially removing the acid catalyst from the reaction mixture.

The silicon-containing compounds prepared in the prior art are used in coating film-forming compositions without substantially removing the acid catalysts used in hydrolytic is condensation. Due to the carry-over of the condensation reaction catalysts, the compositions fail to restrain condensation of silanol even when they are controlled at a stable pH. The resultant compositions are shelf unstable.

If a coating film-forming composition is prepared using from the first such an acidic substance as the hydrolytic condensation catalyst as to keep the silanol at a stable pH, the condensation reaction of silanol groups does not proceed to a full extent, leaving more residual silanol groups. Then, even when the composition is kept at a stable pH, the composition yet lacks shelf stability due to superfluous silanol groups.

It has been found that an outstanding improvement in shelf stability is achieved when a silicon-containing compound is obtained by effecting hydrolytic condensation in the presence of an optimum acid catalyst and substantially removing the acid catalyst from the reaction mixture, and components (C) and (D) are combined therewith.

In a preferred embodiment, M in formula (2) is tertiary sulfonium, secondary iodonium, or quaternary ammonium. When a composition comprising a compound of formula (2) as component (B) is used, a film having an increased degree of crosslinking can be formed following curing. This prevents migration of effective ingredients in the resist film to the silicon-containing film, and achieves lithographic properties equivalent to conventional organic ARC.

In a preferred embodiment, M in formula (2) is photodegradable. If component (B) does not completely volatilize off during heat curing, part of component (B) can be left in the silicon-containing film. This component can adversely affect the profile of resist pattern. If component (B) used is such a compound that the cation moiety is degraded during exposure, it becomes possible to prevent the profile of resist pattern from being adversely affected during exposure. While the cure ability of the silicon-containing compound is drastically improved, a silicon-containing cured film having a good lithographic profile as well can be provided.

The preferred silicon-containing film-forming composition may further comprise water. When water is added to the composition, silanol groups in the silicon-containing compound are activated so that a denser film results from heat curing reaction. Such a dense film allows the overlying photoresist layer to exert lithographic performance equivalent to conventional organic ARC.

The silicon-containing film-forming composition may further comprise a photoacid generator. If component (B) does not completely volatilize off during heat curing and/or exposure, part of component (B) can be left in the silicon-containing film, which can adversely affect the profile of resist pattern. If an acid is generated in the silicon-containing film during resist pattern formation, it prevents the profile of resist pattern from being adversely affected.

In a second aspect, the invention provides a silicon-containing film for use in a multilayer resist process involving the steps of forming an organic film on a processable substrate, forming a silicon-containing film thereon, further forming a resist film thereon from a silicon-free chemically amplified resist composition, patterning the resist film, patterning the silicon-containing film using the resist film pattern, patterning the underlying organic film with the silicon-containing film pattern serving as an etching mask, and etching the processable substrate with the patterned organic film serving as an etching mask, the silicon-containing film being formed from the composition defined above.

Preferably, the silicon-containing film formed from the composition is used in the multilayer resist process wherein the process further involves the step of disposing an organic antireflective coating between the resist film and the silicon-containing film.

In a third aspect, the invention provides a substrate having formed thereon, in sequence, an organic film, a silicon-containing film of the composition defined above, and a photoresist film.

In a fourth aspect, the invention provides a substrate having formed thereon, in sequence, an organic film, a silicon-containing film of the composition defined above, an antireflective coating, and a photoresist film.

Preferably, the organic film is a film having an aromatic framework.

In a fifth aspect, the invention provides a method for forming a pattern in a substrate, comprising the steps of providing the substrate of the third aspect, exposing a pattern circuit region of the photoresist film to radiation, developing the photoresist film with a developer to form a resist pattern, dry etching the silicon-containing film with the resist pattern made an etching mask, etching the organic film with the patterned silicon-containing film made an etching mask, and etching the substrate with the patterned organic film made an etching mask, for forming a pattern in the substrate.

In a sixth aspect, the invention provides a method for forming a pattern in a substrate, comprising the steps of providing the substrate of the fourth aspect, exposing a pattern circuit region of the photoresist film to radiation, developing the photoresist film with a developer to form a resist pattern, dry etching the antireflective coating and the silicon-containing film with the resist pattern made an etching mask, etching the organic film with the patterned silicon-containing film made an etching mask, and etching the substrate with the patterned organic film made an etching mask, for forming a pattern in the substrate.

Preferably, the organic film is a film having an aromatic framework. Typically, the exposing step is carried out by photolithography using radiation having a wavelength equal to or less than 300 nm.

When the intermediate film and the substrate are used and the substrate is patterned by lithography, a microscopic pattern can be formed in the substrate at a high accuracy. When an organic film having an aromatic framework is used, it not only exerts an antireflection effect in the lithography step, but also has sufficient etching resistance in the substrate etching step, allowing for etch processing. Particularly when patterning is carried out by lithography using radiation with wavelength equal to or less than 300 nm, especially ArF excimer laser radiation, a microscopic pattern can be formed at a high accuracy.

BENEFITS OF THE INVENTION

The use of a silicon-containing intermediate film formed from the heat curable silicon-containing film-forming composition of the invention allows the overlying photoresist film to be patterned effectively. Since the silicon-containing intermediate film provides a high etching selectivity relative to an organic material, the formed photoresist pattern can be transferred in sequence to the silicon-containing intermediate film and the organic undercoat film by a dry etching process. Finally, the substrate can be processed at a high accuracy while the organic undercoat film serves as an etching mask. The composition of the invention is effective in minimizing the occurrence of pattern defects after lithography and is shelf stable.

DESCRIPTION OF THE PREFERRED EMBODIMENTS

In the specification, the singular forms "a," "an" and "the" include plural referents unless the context clearly dictates otherwise.

The notation (Cn-Cm) means a group containing from n to m carbon atoms per group.

The terms "mono or polyfunctional" and "mono or polyhydric" are used in a similar meaning. For example, the "mono or polyfunctional" compound is a compound having a functionality of 1, 2 or more.

Component (A) in the heat curable silicon-containing film-forming composition of the invention is a silicon-containing compound which is obtained by effecting hydrolytic condensation of a hydrolyzable silicon compound or monomer in the presence of an acid catalyst. The preferred method of preparing the silicon-containing compound is exemplified below, but not limited thereto.

The starting material or monomer may have the following general formula (3):

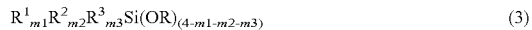

$$R^1{}_{m1}R^2{}_{m2}R^3{}_{m3}Si(OR)_{(4-m1-m2-m3)} \quad (3)$$

wherein R is an alkyl group of 1 to 3 carbon atoms, each of $R^1$, $R^2$ and $R^3$, which may be the same or different, is hydrogen or a monovalent organic group of 1 to 30 carbon atoms, m1, m2 and m3 are equal to 0 or 1, the sum of m1+m2+m3 is equal to 0 to 3, and preferably 0 or 1. One or a mixture of two or more selected from the monomers having formula (3) is subjected to hydrolytic condensation.

As used herein, the term "organic group" refers to a group containing carbon, specifically carbon and hydrogen, and optionally nitrogen, oxygen, sulfur, silicon and other elements. The organic groups represented by $R^1$, $R^2$ and $R^3$ include unsubstituted monovalent hydrocarbon groups, such as straight, branched or cyclic alkyl, alkenyl, alkynyl, aryl and aralkyl groups, substituted forms of the foregoing hydrocarbon groups in which one or more hydrogen atoms are substituted by epoxy, alkoxy, hydroxyl or the like, groups of the general formula (4), shown later, for example, groups which are separated by such a group as —O—, —CO—, —OCO—, —COO—, or —OCOO—, and organic groups containing a silicon-silicon bond.

Preferred examples of $R^1$, $R^2$ and $R^3$ in the monomers of formula (3) include hydrogen, alkyl groups such as methyl, ethyl, n-propyl, iso-propyl, n-butyl, iso-butyl, sec-butyl, t-butyl, n-pentyl, 2-ethylbutyl, 3-ethylbutyl, 2,2-diethylpropyl, cyclopentyl, n-hexyl, and cyclohexyl, alkenyl groups such as vinyl and allyl, alkynyl groups such as ethynyl, and light-absorbing groups like aryl groups such as phenyl and tolyl, and aralkyl groups such as benzyl and phenethyl.

Examples of suitable tetraalkoxysilanes corresponding to formula (3) wherein m1=0, m2=0 and m3=0 include tetramethoxysilane, tetraethoxysilane, tetra-n-propoxysilane, and tetra-iso-propoxysilane. Of these, preferred are tetramethoxysilane and tetraethoxysilane.

Examples of suitable trialkoxysilanes corresponding to formula (3) wherein m1=0, m2=0 and m3=0 include trimethoxysilane, triethoxysilane, tri-n-propoxysilane, triisopropoxysilane, methyltrimethoxysilane, methyltriethoxysilane, methyltri-n-propoxysilane, methyltriisopropoxysilane, ethyltrimethoxysilane, ethyltriethoxysilane, ethyltri-n-propoxysilane, ethyltriisopropoxysilane, vinyltrimethoxysilane, vinyltriethoxysilane, vinyltri-n-propoxysilane, vinyltriisopropoxysilane, n-propyltrimethoxysilane, n-propyltriethoxysilane, n-propyltri-n-propoxysilane, n-propyltriisopropoxysilane, isopropyltrimethoxysilane, isopropyltriethoxysilane, isopropyltri-n-propoxysilane, isopropyltriisopropoxysilane, n-butyltrimethoxysilane, n-butyltriethoxysilane, n-butyltri-n-propoxysilane, n-butyltriisopropoxysilane, sec-butyltrimethoxysilane, sec-butyltriethoxysilane, sec-butyltri-n-propoxysilane, sec-butyltriisopropoxysilane, t-butyltrimethoxysilane, t-butyltriethoxysilane, t-butyltri-n-propoxysilane, t-butyltriisopropoxysilane, cyclopropyltrimethoxysilane, cyclopropyltriethoxysilane, cyclopropyltri-n-propoxysilane, cyclopropyltriisopropoxysilane, cyclobutyltrimethoxysilane, cyclobutyltriethoxysilane, cyclobutyltri-n-propoxysilane, cyclobutyltriisopropoxysilane, cyclopentyltrimethoxysilane, cyclopentyltriethoxysilane, cyclopentyltri-n-propoxysilane, cyclopentyltriisopropoxysilane, cyclohexyltrimethoxysilane, cyclohexyltriethoxysilane, cyclohexyltri-n-propoxysilane, cyclohexyltrlisopropoxysilane, cyclohexenyltrimethoxysilane, cyclohexenyltriethoxysilane, cyclohexenyltri-n-propoxysilane, cyclohexenyltriisopropoxysilane, cyclohexenylethyltrimethoxysilane, cyclohexenylethyltriethoxysilane, cyclohexenylethyltri-n-propoxysilane, cyclohexenylethyltriisopropoxysilane, cyclooctanyltrimethoxysilane, cyclooctanyltriethoxysilane, cyclooctanyltri-n-propoxysilane, cyclooctanyltriisopropoxysilane, cyclopentadienylpropyltrimethoxysilane, cyclopentadienylpropyltriethoxysilane, cyclopentadienylpropyltri-n-propoxysilane, cyclopentadienylpropyltriisopropoxysilane, bicycloheptenyltrimethoxysilane, bicycloheptenyltriethoxysilane, bicycloheptenyltri-n-propoxysilane, bicycloheptenyltriisopropoxysilane, bicycloheptyltrimethoxysilane, bicycloheptyltriethoxysilane, bicycloheptyltri-n-propoxysilane, bicycloheptyltriisopropoxysilane, adamantyltrimethoxysilane, adamantyltriethoxysilane, adamantyltri-n-propoxysilane, adamantyltriisopropoxysilane, etc. Suitable light-absorbing monomers include phenyltrimethoxysilane, phenyltriethoxysilane, phenyltri-n-propoxysilane, phenyltriisopropoxysilane, benzyltrimethoxysilane, benzyltriethoxysilane, benzyltri-n-propoxysilane, benzyltriisopropoxysilane, tolyltrimethoxysilane, tolyltriethoxysilane, tolyltri-n-propoxysilane, tolyltriisopropoxysilane, phenethyltrimethoxysilane, phenethyltriethoxysilane, phenethyltri-n-propoxysilane, phenethyltriisopropoxysilane, naphthyltrimethoxysilane, naphthyltriethoxysilane, naphthyltri-n-propoxysilane, naphthyltriisopropoxysilane, etc.

Of these, preferred are methyltrimethoxysilane, methyltriethoxysilane, ethyltrimethoxysilane, ethyltriethoxysilane, vinyltrimethoxysilane, vinyltriethoxysilane, n-propyltrimethoxysilane, n-propyltriethoxysilane, isopropyltrimethoxysilane, isopropyltriethoxysilane, n-butyltrimethoxysilane, n-butyltriethoxysilane, isobutyltrimethoxysilane, isobutyltriethoxysilane, allyltrimethoxysilane, allyltriethoxysilane, cyclopentyltrimethoxysilane, cyclopentyltriethoxysilane, cyclohexyltrimethoxysilane, cyclohexyltriethoxysilane, cyclohexenyltrimethoxysilane, cyclohexenyltriethoxysilane, phenyltrimethoxysilane, phenyltriethoxysilane, benzyltrimethoxysilane, benzyltriethoxysilane, phenethyltrimethoxysilane, and phenethyltriethoxysilane.

Examples of suitable dialkoxysilanes corresponding to formula (3) wherein m1=1, m2=1 and m3=0 include dimethyldimethoxysilane, dimethyldiethoxysilane, methylethyldimethoxysilane, methylethyldiethoxysilane, dimethyldi-n-propoxysilane, dimethyldiisopropoxysilane, diethyldimethoxysilane, diethyldiethoxysilane, diethyldi-n-propoxysilane, diethyldiisopropoxysilane, di-n-propyldimethoxysilane, di-n-propyldiethoxysilane, di-n-propyldi-n-propoxysilane, di-n-propyldiisopropoxysilane, diisopropyldimethoxysilane, diisopropyldiethoxysilane, diisopropyldi-n-propoxysilane, diisopropyldiisopropoxysilane, di-n-butyldimethoxysilane, di-n-butyldiethoxysilane, di-n-butyldi-n-propoxysilane, di-n-butyldiisopropoxysilane, di-sec-butyldimethoxysilane, di-sec-butyldiethoxysilane, disec-butyldi-n-propoxysilane, di-sec-butyldiisopropoxysilane, di-t-butyldimethoxysilane, di-t-butyldiethoxysilane, di-t-butyldi-n-propoxysilane, di-t-butyldiisopropoxysilane, dicyclopropyldimethoxysilane, dicyclopropyldiethoxysilane, dicyclopropyldi-n-propoxysilane, dicyclopropyldiisopropoxysilane, dicyclobutyldimethoxysilane, dicyclobutyldiethoxysilane, dicyclobutyldi-n-propoxysilane, dicyclobutyldiisopropoxysilane, dicyclopentyldimethoxysilane, dicyclopentyldiethoxysilane, dicyclopentyldi-n-propoxysilane, dicyclopentyldiisopropoxysilane, dicyclohexyldimethoxysilane, dicyclohexyldiethoxysilane, dicyclohexyldi-n-propoxysilane, dicyclohexyldiisopropoxysilane, dicyclohexenyldimethoxysilane, dicyclohexenyldiethoxysilane, dicyclohexenyldi-n-propoxysilane, dicyclohexenyldiisopropoxysilane, dicyclohexenylethyldimethoxysilane, dicyclohexenylethyldiethoxysilane, dicyclohexenylethyldi-n-propoxysilane, dicyclohexenylethyldiisopropoxysilane, dicyclooctanyldimethoxysilane, dicyclooctanyldiethoxysilane, dicyclooctanyldi-n-propoxysilane, dicyclooctanyldiisopropoxysilane, dicyclopentadienylpropyldimethoxysilane, dicyclopentadienylpropyldiethoxysilane, dicyclopentadienylpropyldi-n-propoxysilane, dicyclopentadienylpropyldiisopropoxysilane, bisbicycloheptenyldimethoxysilane, bisbicycloheptenyldiethoxysilane, bisbicycloheptenyldi-n-propoxysilane, bisbicycloheptenyldiisopropoxysilane, bisbicycloheptyldimethoxysilane, bisbicycloheptyldiethoxysilane, bisbicycloheptyldi-n-propoxysilane, bisbicycloheptyldiisopropoxysilane, bisadamantyldimethoxysilane, bisadamantyldiethoxysilane, bisadamantyldi-n-propoxysilane, bisadamantyldiisopropoxysilane, etc. Suitable light-absorbing monomers include diphenyldimethoxysilane, diphenyldiethoxysilane, methylphenyldimethoxysilane, methylphenyldiethoxysilane, diphenyldi-n-propoxysilane, and diphenyldiisopropoxysilane.

Of these, preferred are dimethyldimethoxysilane, dimethyldiethoxysilane, diethyldimethoxysilane, diethyldiethoxysilane, methylethyldimethoxysilane, methylethyldiethoxysilane, di-n-propyldimethoxysilane, di-n-butyldimethoxysilane, methylphenyldimethoxysilane, and methylphenyldiethoxysilane.

Examples of suitable monoalkoxysilanes corresponding to formula (3) wherein m1=1, m2=1 and m3=1 include trimethylmethoxysilane, trimethylethoxysilane, dimethylethylmethoxysilane, and dimethylethylethoxysilane. Suitable light-absorbing monomers include dimethylphenylmethoxysilane, dimethylphenylethoxysilane, dimethylbenzylmethoxysilane, dimethylbenzylethoxysilane, dimethylphenethylmethoxysilane, and dimethylphenethylethoxysilane.

Of these, preferred are trimethylmethoxysilane, dimethylethylmethoxysilane, dimethylphenylmethoxysilane, dimethylbenzylmethoxysilane, and dimethylphenethylmethoxysilane.

Other exemplary organic groups represented by $R^1$, $R^2$ and $R^3$ include organic groups having at least one carbon-oxygen single bond or carbon-oxygen double bond. Illustrative of such groups are organic groups having at least one group selected from among epoxy, ester, alkoxy, and hydroxyl groups. Examples of organic groups having at least one carbon-oxygen single bond or carbon-oxygen double bond in formula (3) include those of the following general formula (4).

$$(P-Q_1-(S_1)_{v1}-Q_2-)_u-(T)_{v2}-Q_3-(S_2)_{v3}-Q_4- \quad (4)$$

Herein, P is a hydrogen atom, hydroxyl group, epoxy ring of the formula:

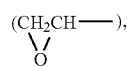

$C_1$-$C_4$ alkoxy group, $C_1$-$C_6$ alkylcarbonyloxy group, or $C_1$-$C_6$ alkylcarbonyl group, $Q_1$, $Q_2$, $Q_3$ and $Q_4$ are each independently —$CqH_{(2q-p)}P_p$— wherein P is as defined above, p is an integer of 0 to 3, and q is an integer of 0 to 10 (with the proviso that q=0 denotes a single bond); u is an integer of 0 to 3, $S_1$ and $S_2$ are each independently —O—, —CO—, —OCO—, —COO—, or —OCOO—; v1, v2 and v3 are each independently 0 or 1. T is a divalent group of aliphatic or aromatic ring which may contain a heteroatom, typically oxygen, examples of which are shown below. Notably, the sites on T where T is bonded to $Q_2$ and $Q_3$ are not particularly limited and may be selected appropriate in accordance with reactivity dependent on steric factors and the availability of commercial reagents used in the reaction.

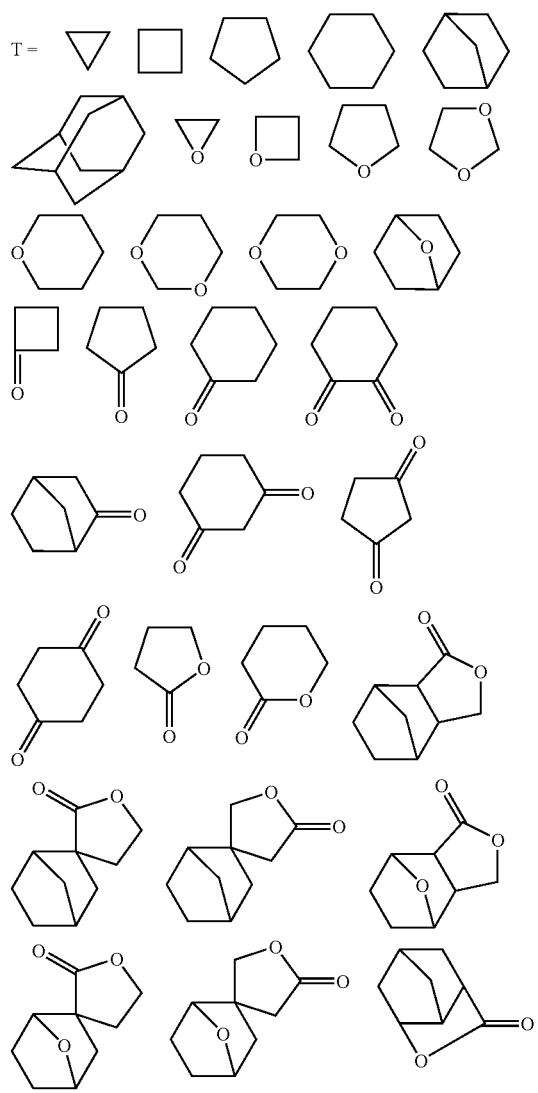

-continued
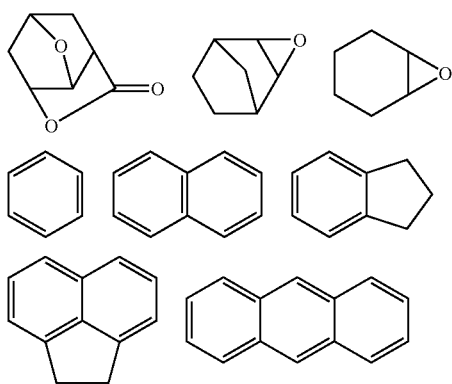
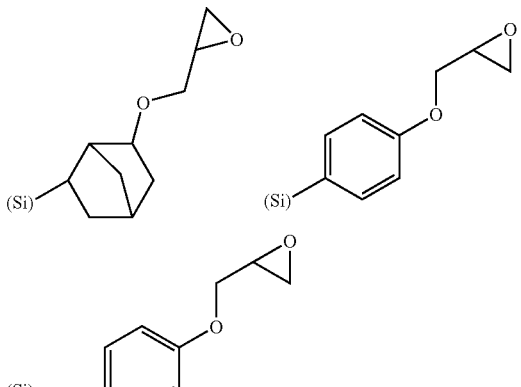
Preferred examples of organic groups having at least one carbon-oxygen single bond or carbon-oxygen double bond in formula (3) are given below. It is noted that in the following formulae, (Si) is depicted to indicate the bonding site to silicon.
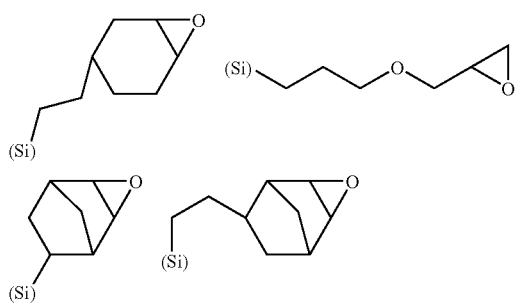
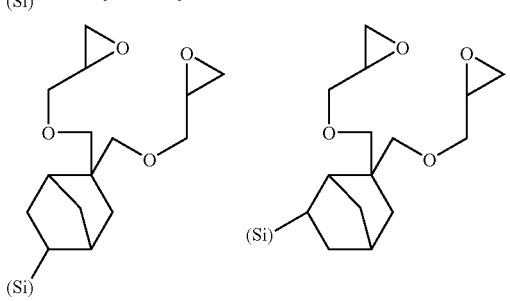
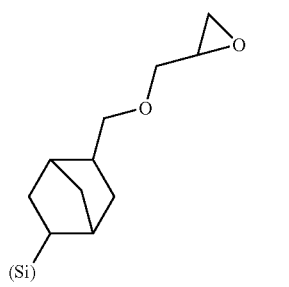
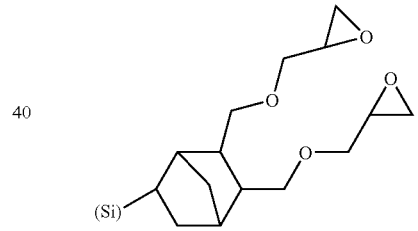
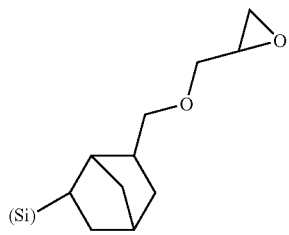
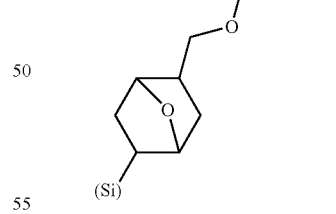
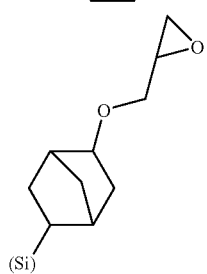
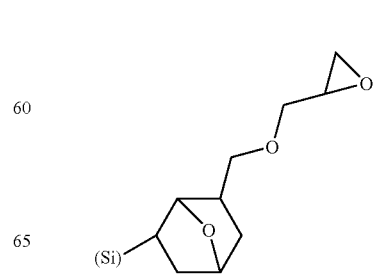

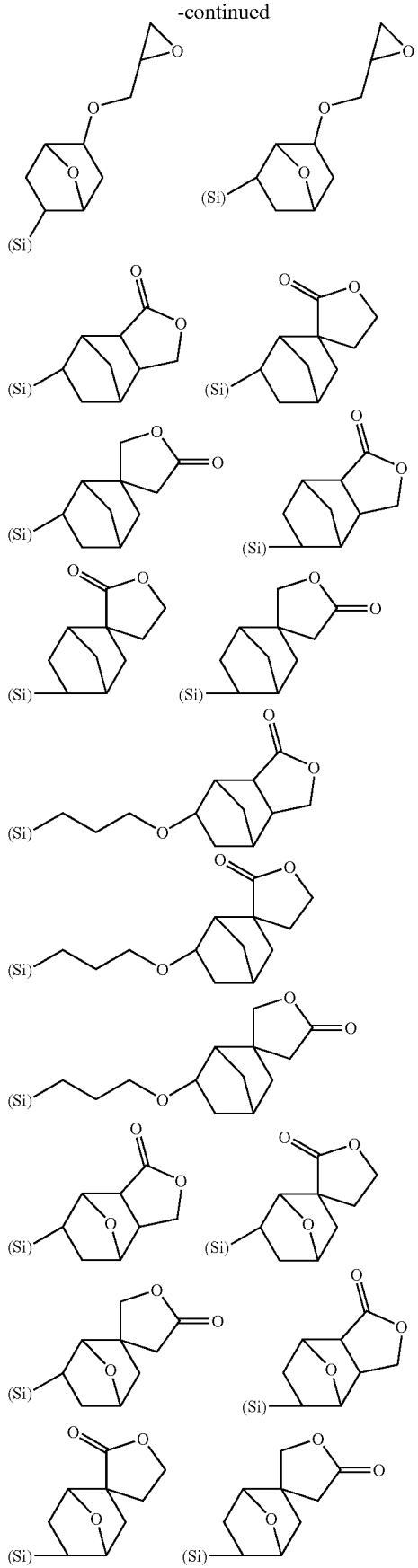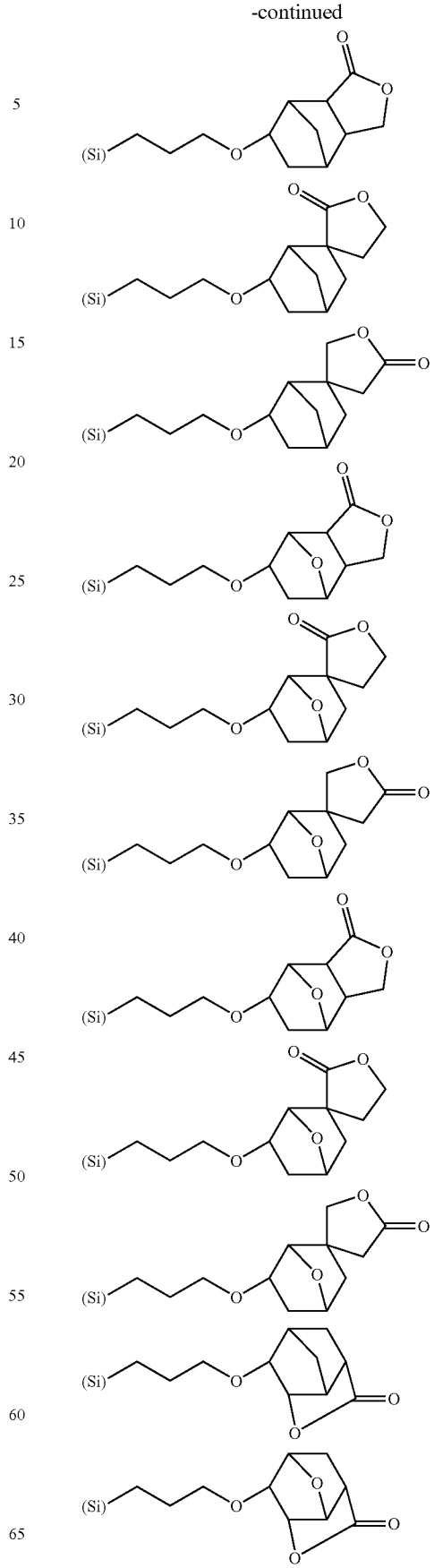

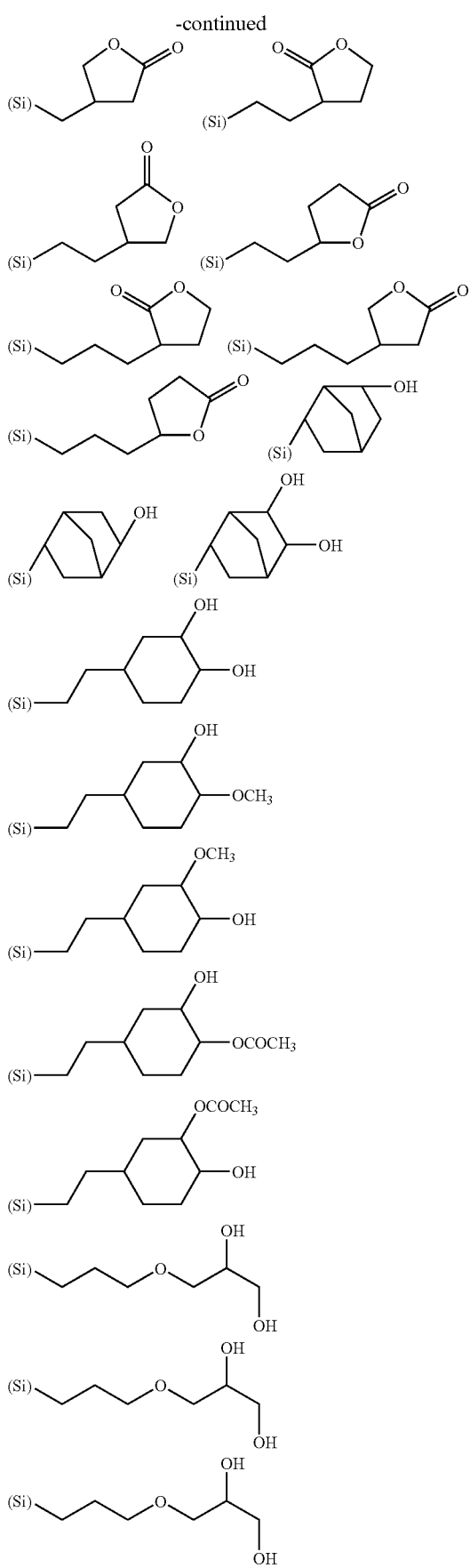
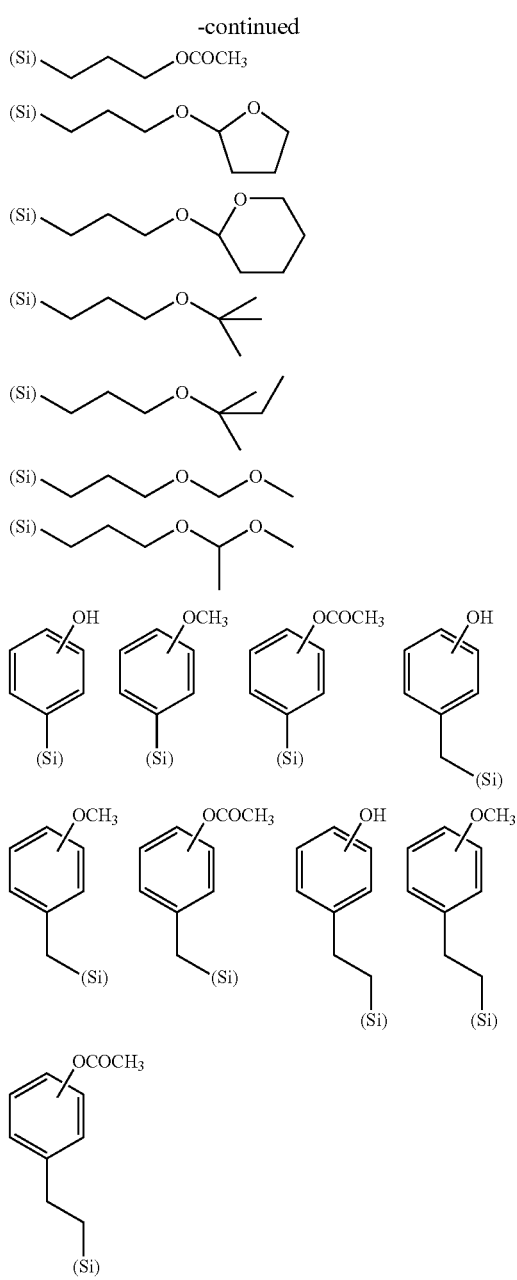
Also included in the organic groups of $R^1$, $R^2$ and $R^3$ are organic groups having a silicon-silicon bond, examples of which are given below.
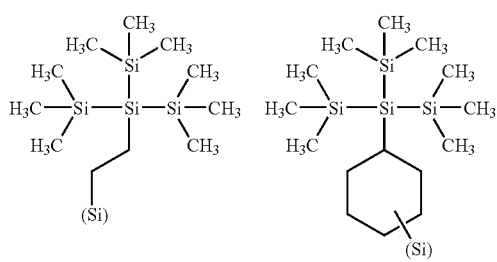

-continued

[chemical structures]

One or more monomers are selected from the foregoing monomers and used as the starting material for reaction to form the silicon-containing compound. Where two or more monomers are used, they may be mixed before or during reaction.

The silicon-containing compound may be prepared by subjecting a suitable monomer(s) to hydrolytic condensation in the presence of an acid catalyst which is selected from mineral acids, aliphatic and aromatic sulfonic acids and mixtures thereof. Suitable acid catalysts which can be used include hydrofluoric acid, hydrochloric acid, hydrobromic acid, sulfuric acid, nitric acid, perchloric acid, phosphoric acid, methanesulfonic acid, benzenesulfonic acid, and toluenesulfonic acid. The catalyst may be used in an amount of $10^{-6}$ to 10 moles, preferably $10^{-5}$ to 5 moles, and more preferably $10^{-4}$ to 1 mole per mole of the silicon monomer(s).

The amount of water used in hydrolytic condensation of the monomer(s) to form the silicon-containing compound is preferably 0.01 to 100 moles, more preferably 0.05 to 50 moles, even more preferably 0.1 to 30 moles per mole of hydrolyzable substituent group(s) on the monomer(s). The addition of more than 100 moles of water is uneconomical in that the apparatus used for reaction becomes accordingly larger.

In one exemplary operating procedure, the monomer is added to an aqueous solution of the catalyst to start hydrolytic condensation. At this point, an organic solvent may be added to the aqueous catalyst solution and/or the monomer may be diluted with an organic solvent. The reaction temperature is 0 to 100° C., preferably 5 to 80° C. In the preferred procedure, the monomer is added dropwise at a temperature of 5 to 80° C., after which the reaction mixture is matured at 20 to 80° C.

Examples of the organic solvent which can be added to the aqueous catalyst solution or to the monomer for dilution include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl-2-n-amylketone, butane diol monomethyl ether, propylene glycol monomethyl ether, ethylene glycol monomethyl ether, butane diol monoethyl ether, propylene glycol monoethyl ether, ethylene glycol monoethyl ether, propylene glycol dimethyl ether, diethylene glycol dimethyl ether, propylene glycol monomethyl ether acetate (PGMEA), propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, and mixtures thereof.

Among others, water-soluble solvents are preferred. Suitable water-soluble solvents include alcohols such as methanol, ethanol, 1-propanol and 2-propanol, polyhydric alcohols such as ethylene glycol and propylene glycol, polyhydric alcohol condensation derivatives such as butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether, acetone, acetonitrile, and tetrahydrofuran. Of these, those solvents having a boiling point equal to or lower than 100° C. are preferred.

The amount of the organic solvent used is 0 to 1,000 ml, preferably 0 to 500 ml per mole of the monomer. Too much amounts of the organic solvent are uneconomical in that the reactor must be of larger volume.

Thereafter, neutralization reaction of the catalyst is carried out if necessary, and the alcohol produced by the hydrolytic condensation reaction is removed under reduced pressure, yielding an aqueous reaction mixture. The amount of an alkaline compound used for neutralization is preferably 0.1 to 2 equivalents relative to the acid used as the catalyst. Any alkaline compound may be used as long as it exhibits alkalinity in water.

Subsequently, the alcohol produced by the hydrolytic condensation reaction must be removed from the reaction mixture. To this end, the reaction mixture is heated at a temperature which is preferably 0 to 100° C., more preferably 10 to 90° C., even more preferably 15 to 80° C., although the temperature depends on the type of organic solvent added and the type of alcohol produced. The reduced pressure is preferably atmospheric or subatmospheric, more preferably equal to or less than 80 kPa in absolute pressure, and even more preferably equal to or less than 50 kPa in absolute pressure, although the pressure varies with the type of organic solvent and alcohol to be removed and the vacuum pump, condenser, and heating temperature. Although an accurate determination of the amount of alcohol removed at this point is difficult, it is desired to remove about 80% by weight or more of the alcohol produced.

Next, the acid catalyst used in the hydrolytic condensation may be removed from the reaction mixture. This is achieved by extracting the silicon-containing compound with an organic solvent. The organic solvent used herein is preferably a solvent in which the silicon-containing compound is dissolvable and which provides two-layer separation when mixed with water. Suitable organic solvents include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl-2-n-amylketone, butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, methyl isobutyl ketone, cyclopentyl methyl ether, and mixtures thereof.

It is also acceptable to use a mixture of a water-soluble organic solvent and a substantially water-insoluble organic solvent. Exemplary mixtures include, but are not limited to, combinations of methanol+ethyl acetate, ethanol+ethyl acetate, 1-propanol+ethyl acetate, 2-propanol+ethyl acetate, butane diol monomethyl ether+ethyl acetate, propylene glycol monomethyl ether+ethyl acetate, ethylene glycol monomethyl ether+ethyl acetate, butane diol monoethyl ether+ethyl acetate, propylene glycol monoethyl ether+ethyl acetate, ethylene glycol monoethyl ether+ethyl acetate, butane diol monopropyl ether+ethyl acetate, propylene glycol monopropyl ether+ethyl acetate, ethylene glycol monopropyl ether+ethyl acetate, methanol+methyl isobutyl ketone (MIK), ethanol+MIK, 1-propanol+MIK, 2-propanol+MIK, propylene glycol monomethyl ether+MIK, ethylene glycol monomethyl ether+MIK, propylene glycol monoethyl ether+MIK, ethylene glycol monoethyl ether+MIK, propylene glycol monopropyl ether+MIK, ethylene glycol monopropyl ether+MIK, methanol+cyclopentyl methyl ether, ethanol+cyclopentyl methyl ether, 1-propanol+cyclopentyl methyl ether, 2-propanol+cyclopentyl methyl ether, propylene glycol monomethyl ether+cyclopentyl methyl ether, ethylene glycol monomethyl ether+cyclopentyl methyl ether, propylene glycol monoethyl ether+cyclopentyl methyl ether, ethylene glycol monoethyl ether+cyclopentyl methyl ether, propylene glycol monopropyl ether+cyclopentyl methyl ether, ethylene glycol monopropyl ether+cyclopentyl methyl ether, methanol+propylene glycol methyl ether acetate (PGMEA), ethanol+PGMEA, 1-propanol+PGMEA, 2-propanol+PGMEA, propylene glycol monomethyl ether+PGMEA, ethylene glycol monomethyl ether+PGMEA, propylene glycol monoethyl ether+PGMEA, ethylene glycol monoethyl ether+PGMEA, propylene glycol monopropyl ether+PGMEA, and ethylene glycol monopropyl ether+PGMEA.

A mixing proportion of the water-soluble organic solvent and the substantially water-insoluble organic solvent may be determined as appropriate although it is a usual practice to use 0.1 to 1,000 parts, preferably 1 to 500 parts, and more preferably 2 to 100 parts by weight of the water-soluble organic solvent per 100 parts by weight of the substantially water-insoluble organic solvent.

Subsequent step is to wash with neutral water. The water used for washing may be deionized water or ultrapure water. The amount of water is 0.01 to 100 liters (L), preferably 0.05 to 50 L, more preferably 0.1 to 5 L per liter of the silicon-containing compound solution. The washing step may be carried out by feeding both the liquids into a common vessel, agitating the contents, allowing the mixture to stand and to separate into two layers, and removing the water layer. The number of washing steps may be one or more, although the repetition of more than 10 washing steps does not achieve the effect corresponding to such a number of steps. Preferably the number of washing steps is from 1 to about 5.

Other methods of removing the acid catalyst include the use of an ion-exchange resin, and neutralization with epoxy compounds such as ethylene oxide and propylene oxide followed by removal. A proper method may be selected from among these methods in accordance with the acid catalyst used in the reaction.

As used herein, the term "substantially removing the acid catalyst" means that it is acceptable that no more than 10% by weight, preferably no more than 5% by weight of the acid catalyst used in the reaction is left in the silicon-containing compound.

Since the water washing operation may sometimes achieve an effect substantially equivalent to a fractionation operation in that part of the silicon-containing compound is carried away to the water layer, the number of washing cycles and the amount of water may be determined appropriate depending on the relative extent of catalyst removal and fractionation effects.

A final solvent is added to the silicon-containing compound solution from which the acid catalyst may or may not have been removed, for inducing solvent exchange under a reduced pressure, yielding a silicon-containing compound solution. The temperature for solvent exchange is preferably 0 to 100° C., more preferably 10 to 90° C., even more preferably 15 to 80° C., although the temperature depends on the type of reaction or extraction solvent to be removed. The reduced pressure is preferably atmospheric or subatmospheric, more preferably equal to or less than 80 kPa in absolute pressure, and even more preferably equal to or less than 50 kPa in absolute pressure, although the pressure varies with the type of extraction solvent to be removed and the vacuum pump, condenser, and heating temperature.

As a result of solvent exchange, the silicon-containing compound sometimes becomes unstable. Such instability occurs depending on the compatibility of the silicon-containing compound with the final solvent. Component (C) to be described later may be added as a stabilizer in order to prevent such inconvenience. The amount of component (C) added is 0 to 25 parts, preferably 0 to 15 parts, more preferably 0 to 5 parts by weight per 100 parts by weight of the silicon-containing compound in the solution prior to the solvent exchange. When added, the preferred amount of component (C) is at least 0.5 part by weight. If necessary for the solution before the solvent exchange, component (C) may be added before the solvent exchange operation is carried out.

If the silicon-containing compound is concentrated above a certain level, it undergoes condensation reaction so that it converts to the state which can no longer be re-dissolved in organic solvents. It is then recommended that the silicon-containing compound be kept in solution form at an adequate concentration. The concentration is specifically equal to or less than 50% by weight, more specifically equal to or less than 40% by weight, and even more specifically equal to or less than 30% by weight.

The final solvent added to the silicon-containing compound solution is preferably an alcoholic solvent, examples of which include monoalkyl ethers of ethylene glycol, diethylene glycol, triethylene glycol and the like, and monoalkyl ethers of propylene glycol, dipropylene glycol and the like. Preferred examples include butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether.

In another exemplary reaction procedure, water or a water-containing organic solvent is added to the monomer or an organic solvent solution of the monomer to start hydrolytic reaction. At this point, the catalyst may be added to the monomer or an organic solvent solution of the monomer, or water or a water-containing organic solvent. The reaction temperature is 0 to 100° C., preferably 10 to 80° C. In the preferred procedure, water is added dropwise at a temperature of 10 to 50° C., after which the reaction mixture is matured at 20 to 80 C.

Of the organic solvents, if used, water-soluble solvents are preferred. Suitable organic solvents include methanol, ethanol, 1-propanol, 2-propanol, 1-butanol, 2-butanol, 2-methyl-1-propanol, acetone, tetrahydrofuran, acetonitrile, and polyhydric alcohol condensation derivatives such as butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether, and mixtures thereof.

The amount of the organic solvent used may be the same as described above for the one procedure. The resulting reaction mixture is post-treated as described above for the one procedure, yielding a silicon-containing compound.

The molecular weight of the resulting silicon-containing compound may be adjusted by a choice of monomer(s) and by control of reaction conditions during polymerization. Compounds having a weight average molecular weight in excess of 100,000 may produce foreign matter or coating specks in some cases. Then the silicon-containing compound preferably has a weight average molecular weight equal to or less than 100,000, more preferably 200 to 50,000, and even more preferably 300 to 30,000. It is noted that the weight average molecular weight is determined by gel permeation chromatography (GPC) using an RI detector and polystyrene standards.

In the silicon-containing film-forming composition of the invention, two or more silicon-containing compounds which differ in composition and/or reaction conditions may be contained as long as they are prepared under acidic conditions.

According to the invention, a silicon-containing film-forming composition can be formulated by compounding (A) the silicon-containing compound described above with (B) a thermal crosslink accelerator, (C) an acid, (D) a stabilizer, and (E) an organic solvent.

The composition of the invention must contain a thermal crosslink accelerator as component (B) to further accelerate crosslinking reaction in forming a silicon-containing film. Included in the accelerator are compounds having the general formulae (1) and (2).

$$L_a H_b X \tag{1}$$

Herein L is lithium, sodium, potassium, rubidium or cesium, X is a hydroxyl group or a mono or polyfunctional organic acid residue of 1 to 30 carbon atoms, "a" is an integer of at least 1, "b" is 0 or an integer of at least 1, and a+b is equal to the valence of hydroxyl group or organic acid residue.

$$M_a H_b A \tag{2}$$

Herein M is sulfonium, iodonium or ammonium, preferably tertiary sulfonium, secondary iodonium, or quaternary ammonium, and more preferably a photo-degradable onium like triphenylsulfonium or diphenyliodonium. A is as defined above for X or a non-nucleophilic counter ion, "a" and "b" are as defined above, and a+b is equal to the valence of hydroxyl group, organic acid residue or non-nucleophilic counter ion.

Exemplary of the compound of formula (1) are alkali metal salts of organic acids, for example, salts of lithium, sodium, potassium, rubidium and cesium with hydroxide, formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid and other monofunctional acids; and salts of lithium, sodium, potassium, rubidium and cesium with mono- or di-functional acids such as oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, citric acid, and carbonic acid.

Illustrative examples include lithium formate, lithium acetate, lithium propionate, lithium butanoate, lithium pentanoate, lithium hexanoate, lithium heptanoate, lithium octanoate, lithium nonanoate, lithium decanoate, lithium oleate, lithium stearate, lithium linoleate, lithium linolenate, lithium benzoate, lithium phthalate, lithium isophthalate, lithium terephthalate, lithium salicylate, lithium trifluoromethanesulfonate, lithium trifluoroacetate, lithium monochloroacetate, lithium dichloroacetate, lithium trichloroacetate, lithium hydroxide, lithium hydrogen oxalate, lithium hydrogen malonate, lithium hydrogen methylmalonate, lithium hydrogen ethylmalonate, lithium hydrogen propylmalonate, lithium hydrogen butylmalonate, lithium hydrogen dimethylmalonate, lithium hydrogen diethylmalonate, lithium hydrogen succinate, lithium hydrogen methylsuccinate, lithium hydrogen glutarate, lithium hydrogen adipate, lithium hydrogen itaconate, lithium hydrogen maleate, lithium hydrogen fumarate, lithium hydrogen citraconate, lithium hydrogen citrate, lithium hydrogen carbonate, lithium oxalate, lithium malonate, lithium methylmalonate, lithium ethylmalonate, lithium propylmalonate, lithium butylmalonate, lithium dimethylmalonate, lithium diethylmalonate, lithium succinate, lithium methylsuccinate, lithium glutarate, lithium adipate, lithium itaconate, lithium maleate, lithium fumarate, lithium citraconate, lithium citrate, lithium carbonate;

sodium formate, sodium acetate, sodium propionate, sodium butanoate, sodium pentanoate, sodium hexanoate, sodium heptanoate, sodium octanoate, sodium nonanoate, sodium decanoate, sodium oleate, sodium stearate, sodium linoleate, sodium linolenate, sodium benzoate, sodium phthalate, sodium isophthalate, sodium terephthalate, sodium salicylate, sodium trifluoromethanesulfonate, sodium trifluoroacetate, sodium monochloroacetate, sodium dichloroacetate, sodium trichloroacetate, sodium hydroxide, sodium hydrogen oxalate, sodium hydrogen malonate, sodium hydrogen methylmalonate, sodium hydrogen ethylmalonate, sodium hydrogen propylmalonate, sodium hydrogen butylmalonate, sodium hydrogen dimethylmalonate, sodium hydrogen diethylmalonate, sodium hydrogen succinate, sodium hydrogen methylsuccinate, sodium hydrogen glutarate, sodium hydrogen adipate, sodium hydrogen itaconate, sodium hydrogen maleate, sodium hydrogen fumarate, sodium hydrogen citraconate, sodium hydrogen citrate, sodium hydrogen carbonate, sodium oxalate, sodium malonate, sodium methylmalonate, sodium ethylmalonate, sodium propylmalonate, sodium butylmalonate, sodium dimethylmalonate, sodium diethylmalonate, sodium succinate, sodium methylsuccinate, sodium glutarate, sodium adipate, sodium itaconate, sodium maleate, sodium fumarate, sodium citraconate, sodium citrate, sodium carbonate;

potassium formate, potassium acetate, potassium propionate, potassium butanoate, potassium pentanoate, potassium hexanoate, potassium heptanoate, potassium octanoate, potassium nonanoate, potassium decanoate, potassium oleate, potassium stearate, potassium linoleate, potassium linolenate, potassium benzoate, potassium phthalate, potassium isophthalate, potassium terephthalate, potassium salicylate, potassium trifluoromethanesulfonate, potassium trifluoroacetate, potassium monochloroacetate, potassium dichloroacetate, potassium trichloroacetate, potassium hydroxide, potassium hydrogen oxalate, potassium hydrogen malonate, potassium hydrogen methylmalonate, potassium hydrogen ethylmalonate, potassium hydrogen propylmalonate, potassium hydrogen butylmalonate, potassium hydrogen dimethylmalonate, potassium hydrogen diethylmalonate, potassium hydrogen succinate, potassium hydrogen methylsuccinate, potassium hydrogen glutarate, potassium hydrogen adipate, potassium hydrogen itaconate, potassium hydrogen maleate, potassium hydrogen fumarate, potassium hydrogen citraconate, potassium hydrogen citrate, potassium hydrogen carbonate, potassium oxalate, potassium malonate, potassium methylmalonate, potassium ethylmalonate, potassium propylmalonate, potassium butylmalonate, potassium dimethylmalonate, potassium diethylmalonate, potassium succinate, potassium methylsuccinate, potassium glutarate, potassium adipate, potassium itaconate, potassium maleate, potassium fumarate, potassium citraconate, potassium citrate, potassium carbonate, etc.

The compounds of formula (2) include sulfonium, iodonium and ammonium compounds having the formulae (Q-1), (Q-2), and (Q-3), respectively.

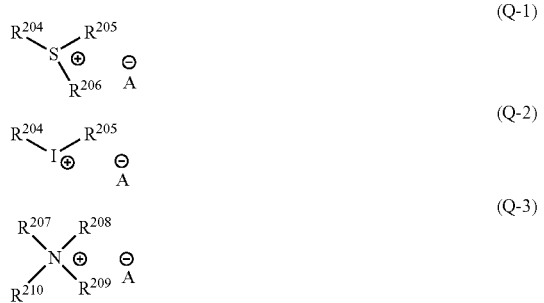

Herein, $R^{204}$, $R^{205}$ and $R^{206}$ are each independently a straight, branched or cyclic alkyl, alkenyl, oxoalkyl or oxoalkenyl group of 1 to 12 carbon atoms, substituted or unsubstituted aryl group of 6 to 20 carbon atoms, aralkyl or aryloxoalkyl group of 7 to 12 carbon atoms, in which some or all hydrogen atoms may be substituted by alkoxy groups or the like. A pair of $R^{205}$ and $R^{206}$ may form a ring, and each is a $C_1$-$C_6$ alkylene group when they form a ring. $A^-$ is a non-nucleophilic counter ion. $R^{207}$, $R^{208}$, $R^{209}$, and $R^{210}$ are as defined for $R^{204}$, $R^{205}$ and $R^{206}$, and may also be hydrogen. A pair of $R^{207}$ and $R^{208}$ or a combination of $R^{207}$, $R^{208}$ and $R^{209}$ may form a ring, and each is a $C_3$-$C_{10}$ alkylene group when they form a ring. $R^{204}$, $R^{205}$, $R^{206}$, $R^{207}$, $R^{208}$, $R^{209}$, and $R^{210}$ may be the same or different. Suitable alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Suitable alkenyl groups include vinyl, allyl, propenyl, butenyl, hexenyl, and cyclohexenyl. Suitable oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Suitable aryl groups include phenyl and naphthyl, alkoxyphenyl groups such as p-methoxyphenyl, m-methoxyphenyl, o-methoxyphenyl, ethoxyphenyl, p-tert-butoxyphenyl, and m-tert-butoxyphenyl, alkylphenyl groups such as 2-methylphenyl, 3-methylphenyl, 4-methylphenyl, ethylphenyl, 4-tert-butylphenyl, 4-butylphenyl, and dimethylphenyl, alkylnaphthyl groups such as methylnaphthyl and ethylnaphthyl, alkoxynaphthyl groups such as methoxynaphthyl and ethoxynaphthyl, dialkylnaphthyl groups such as dimethylnaphthyl and diethylnaphthyl, and dialkoxynaphthyl groups such as dimethoxynaphthyl and diethoxynaphthyl. Suitable aralkyl groups include benzyl, phenylethyl and phenethyl. Suitable aryloxoalkyl groups include 2-aryl-2-oxoethyl groups such as 2-phenyl-2-oxoethyl, 2-(1-naphthyl)-2-oxoethyl and 2-(2-naphthyl)-2-oxoethyl.

Examples of the non-nucleophilic counter ion represented by $A^-$ include hydroxyl, formate, acetate, propionate, butanoate, pentanoate, hexanoate, heptanoate, octanoate, nonanoate, decanoate, oleate, stearate, linoleate, linolenate, benzoate, p-methylbenzoate, p-t-butylbenzoate, phthalate, isophthalate, terephthalate, salicylate, trifluoroacetate, monochloroacetate, dichloroacetate, trichloroacetate, fluoride, chloride, bromide, iodide, nitrate, chlorate, perchlorate, bromate, iodate, oxalate, malonate, methylmalonate, ethylmalonate, propylmalonate, butylmalonate, dimethylmalonate, diethylmalonate, succinate, methylsuccinate, glutarate, adipate, itaconate, maleate, fumarate, citraconate, citrate, and carbonate ions.

Specifically, suitable sulfonium compounds include triphenylsulfonium formate, triphenylsulfonium acetate, triphenylsulfonium propionate, triphenylsulfonium butanoate, triphenylsulfonium pentanoate, triphenylsulfonium hexanoate, triphenylsulfonium heptanoate, triphenylsulfonium octanoate, triphenylsulfonium nonanoate, triphenylsulfonium decanoate, triphenylsulfonium oleate, triphenylsulfonium stearate, triphenylsulfonium linoleate, triphenylsulfonium linolenate, triphenylsulfonium benzoate, triphenylsulfonium p-methylbenzoate, triphenylsulfonium p-t-butylbenzoate, triphenylsulfonium phthalate, triphenylsulfonium isophthalate, triphenylsulfonium terephthalate, triphenylsulfonium salicylate, triphenylsulfonium trifluoroacetate, triphenylsulfonium monochloroacetate, triphenylsulfonium dichloroacetate, triphenylsulfonium trichloroacetate, triphenylsulfonium hydroxide, triphenylsulfonium oxalate, triphenylsulfonium malonate, triphenylsulfonium methylmalonate, triphenylsulfonium ethylmalonate, triphenylsulfonium propylmalonate, triphenylsulfonium butylmalonate, triphenylsulfonium dimethylmalonate, triphenylsulfonium diethylmalonate, triphenylsulfonium succinate, triphenylsulfonium methylsuccinate, triphenylsulfonium glutarate, triphenylsulfonium adipate, triphenylsulfonium itaconate, triphenylsulfonium maleate, triphenylsulfonium fumarate, triphenylsulfonium citraconate, triphenylsulfonium citrate, triphenylsulfonium carbonate, triphenylsulfonium chloride, triphenylsulfonium bromide, triphenylsulfonium iodide, triphenylsulfonium nitrate, triphenylsulfonium chlorate, triphenylsulfonium perchlorate, triphenylsulfonium bromate, triphenylsulfonium iodate, bistriphenylsulfonium oxalate, bistriphenylsulfonium malonate, bistriphenylsulfonium methylmalonate, bistriphenylsulfonium ethylmalonate, bistriphenylsulfonium propylmalonate, bistriphenylsulfonium butylmalonate, bistriphenylsulfonium dimethylmalonate, bistriphenylsulfonium diethylmalonate, bistriphenylsulfonium succinate, bistriphenylsulfonium methylsuccinate, bistriphenylsulfonium glutarate, bistriphenylsulfonium adipate, bistriphenylsulfonium itaconate, bistriphenylsulfonium maleate, bistriphenylsulfonium fumarate, bistriphenylsulfonium citraconate, bistriphenylsulfonium citrate, and bistriphenylsulfonium carbonate.

Suitable iodonium compounds include diphenyliodonium formate, diphenyliodonium acetate, diphenyliodonium propionate, diphenyliodonium butanoate, diphenyliodonium pentanoate, diphenyliodonium hexanoate, diphenyliodonium heptanoate, diphenyliodonium octanoate, diphenyliodonium nonanoate, diphenyliodonium decanoate, diphenyliodonium oleate, diphenyliodonium stearate, diphenyliodonium linoleate, diphenyliodonium linolenate, diphenyliodonium benzoate, diphenyliodonium p-methylbenzoate, diphenyliodonium p-t-butylbenzoate, diphenyliodonium phthalate, diphenyliodonium isophthalate, diphenyliodonium terephthalate, diphenyliodonium salicylate, diphenyliodonium trifluoroacetate, diphenyliodonium monochloroacetate, diphenyliodonium dichloroacetate, diphenyliodonium trichloroacetate, diphenyliodonium hydroxide, diphenyliodonium oxalate, diphenyliodonium malonate, diphenyliodonium methylmalonate, diphenyliodonium ethylmalonate, diphenyliodonium propylmalonate, diphenyliodonium butylmalonate, diphenyliodonium dimethylmalonate, diphenyliodonium diethylmalonate, diphenyliodonium succinate, diphenyliodonium methylsuccinate, diphenyliodonium glutarate, diphenyliodonium adipate, diphenyliodonium itaconate, diphenyliodonium maleate, diphenyliodonium fumarate, diphenyliodonium citraconate, diphenyliodonium citrate, diphenyliodonium carbonate, diphenyliodonium chloride, diphenyliodonium bromide, diphenyliodonium iodide, diphenyliodonium nitrate, diphenyliodonium chlorate, diphenyliodonium perchlorate, diphenyliodonium bromate, diphenyliodonium iodate, bisdiphenyliodonium oxalate, bisdiphenyliodonium malonate, bisdiphenyliodonium methylmalonate, bisdiphenyliodonium ethylmalonate, bisdiphenyliodonium propylmalonate, bisdiphenyliodonium butylmalonate, bisdiphenyliodonium dimethylmalonate, bisdiphenyliodonium diethylmalonate, bisdiphenyliodonium succinate, bisdiphenyliodonium methylsuccinate, bisdiphenyliodonium glutarate, bisdiphenyliodonium adipate, bisdiphenyliodonium itaconate, bisdiphenyliodonium maleate, bisdiphenyliodonium fumarate, bisdiphenyliodonium citraconate, bisdiphenyliodonium citrate, and bisdiphenyliodonium carbonate.

Suitable ammonium compounds include tetramethylammonium formate, tetramethylammonium acetate, tetramethylammonium propionate, tetramethylammonium butanoate, tetramethylammonium pentanoate, tetramethylammonium hexanoate, tetramethylammonium heptanoate, tetramethylammonium octanoate, tetramethylammonium nonanoate, tetramethylammonium decanoate, tetramethylammonium oleate, tetramethylammonium stearate, tetramethylammonium linoleate, tetramethylammonium linolenate, tetramethylammonium benzoate, tetramethylammonium p-methylbenzoate, tetramethylammonium p-t-butylbenzoate, tetramethylammonium phthalate, tetramethylammonium isophthalate, tetramethylammonium terephthalate, tetramethylammonium salicylate, tetramethylammonium trifluoroacetate, tetramethylammonium monochloroacetate, tetramethylammonium dichloroacetate, tetramethylammonium trichloroacetate, tetramethylammonium hydroxide, tetramethylammonium oxalate, tetramethylammonium malonate, tetramethylammonium methylmalonate, tetramethylammonium ethylmalonate, tetramethylammonium propylmalonate, tetramethylammonium butylmalonate, tetramethylammonium dimethylmalonate, tetramethylammonium diethylmalonate, tetramethylammonium succinate, tetramethylammonium methylsuccinate, tetramethylammonium glutarate, tetramethylammonium adipate, tetramethylammonium itaconate, tetramethylammonium maleate, tetramethylammonium fumarate, tetramethylammonium citraconate, tetramethylammonium citrate, tetramethylammonium carbonate, tetramethylammonium chloride, tetramethylammonium bromide, tetramethylammonium iodide, tetramethylammonium nitrate, tetramethylammonium chlorate, tetramethylammonium perchlorate, tetramethylammonium bromate, tetramethylammonium iodate, bistetramethylammonium oxalate, bistetramethylammonium malonate, bistetramethylammonium methylmalonate, bistetramethylammonium ethylmalonate, bistetramethylammonium propylmalonate, bistetramethylammonium butylmalonate, bistetramethylammonium dimethylmalonate, bistetramethylammonium diethylmalonate, bistetramethylammonium succinate, bistetramethylammonium methylsuccinate, bistetramethylammonium glutarate, bistetramethylammonium adipate, bistetramethylammonium itaconate, bistetramethylammonium maleate, bistetramethylammonium fumarate, bistetramethylammonium citraconate, bistetramethylammonium citrate, bistetramethylammonium carbonate; tetrapropylammonium formate, tetrapropylammonium acetate, tetrapropylammonium propionate, tetrapropylammonium butanoate, tetrapropylammonium pentanoate, tetrapropylammonium hexanoate, tetrapropylammonium heptanoate, tetrapropylammonium octanoate, tetrapropylammonium nonanoate, tetrapropylammonium decanoate, tetrapropylammonium oleate, tetrapropylammonium stearate, tetrapropylammonium linoleate, tetrapropylammonium linolenate, tetrapropylammonium benzoate, tetrapropylammonium p-methylbenzoate, tetrapropylammonium p-t-butylbenzoate, tetrapropylammonium phthalate, tetrapropylammonium isophthalate, tetrapropylammonium terephthalate, tetrapropylammonium salicylate, tetrapropylammonium trifluoroacetate, tetrapropylammonium monochloroacetate, tetrapropylammonium dichloroacetate, tetrapropylammonium trichloroacetate, tetrapropylammonium hydroxide, tetrapropylammonium oxalate, tetrapropylammonium malonate, tetrapropylammonium methylmalonate, tetrapropylammonium ethylmalonate, tetrapropylammonium propylmalonate, tetrapropylammonium butylmalonate, tetrapropylammonium dimethylmalonate, tetrapropylammonium diethylmalonate, tetrapropylammonium succinate, tetrapropylammonium methylsuccinate, tetrapropylammonium glutarate, tetrapropylammonium adipate, tetrapropylammonium itaconate, tetrapropylammonium maleate, tetrapropylammonium fumarate, tetrapropylammonium citraconate, tetrapropylammonium citrate, tetrapropylammonium carbonate, tetrapropylammonium chloride, tetrapropylammonium bromide, tetrapropylammonium iodide, tetrapropylammonium nitrate, tetrapropylammonium chlorate, tetrapropylammonium perchlorate, tetrapropylammonium bromate, tetrapropylammonium iodate, bistetrapropylammonium oxalate, bistetrapropylammonium malonate, bistetrapropylammonium methylmalonate, bistetrapropylammonium ethylmalonate, bistetrapropylammonium propylmalonate, bistetrapropylammonium butylmalonate, bistetrapropylammonium dimethylmalonate, bistetrapropylammonium diethylmalonate, bistetrapropylammonium succinate, bistetrapropylammonium methylsuccinate, bistetrapropylammonium glutarate, bistetrapropylammonium adipate, bistetrapropylammonium itaconate, bistetrapropylammonium maleate, bistetrapropylammonium fumarate, bistetrapropylammonium citraconate, bistetrapropylammonium citrate, bistetrapropylammonium carbonate; and tetrabutylammonium formate, tetrabutylammonium acetate, tetrabutylammonium propionate, tetrabutylammonium butanoate, tetrabutylammonium pentanoate, tetrabutylammonium hexanoate, tetrabutylammonium heptanoate, tetrabutylammonium octanoate, tetrabutylammonium nonanoate, tetrabutylammonium decanoate, tetrabutylammonium oleate, tetrabutylammonium stearate, tetrabutylammonium linoleate, tetrabutylammonium linolenate, tetrabutylammonium benzoate, tetrabutylammonium p-methylbenzoate, tetrabutylammonium p-t-butylbenzoate, tetrabutylammonium phthalate, tetrabutylammonium isophthalate, tetrabutylammonium terephthalate, tetrabutylammonium salicylate, tetrabutylammonium trifluoroacetate, tetrabutylammonium monochloroacetate, tetrabutylammonium dichloroacetate, tetrabutylammonium trichloroacetate, tetrabutylammonium hydroxide, tetrabutylammonium oxalate, tetrabutylammonium malonate, tetrabutylammonium methylmalonate, tetrabutylammonium ethylmalonate, tetrabutylammonium propylmalonate, tetrabutylammonium butylmalonate, tetrabutylammonium dimethylmalonate, tetrabutylammonium diethylmalonate, tetrabutylammonium succinate, tetrabutylammonium methylsuccinate, tetrabutylammonium glutarate, tetrabutylammonium adipate, tetrabutylammonium itaconate, tetrabutylammonium maleate, tetrabutylammonium fumarate, tetrabutylammonium citraconate, tetrabutylammonium citrate, tetrabutylammonium carbonate, tetrabutylammonium chloride, tetrabutylammonium bromide, tetrabutylammonium iodide, tetrabutylammonium nitrate, tetrabutylammonium chlorate, tetrabutylammonium perchlorate, tetrabutylammonium bromate, tetrabutylammonium iodate, bistetrabutylammonium oxalate, bistetrabutylammonium malonate, bistetrabutylammonium methylmalonate, bistetrabutylammonium ethylmalonate, bistetrabutylammonium propylmalonate, bistetrabutylammonium butylmalonate, bistetrabutylammonium dimethylmalonate, bistetrabutylammonium diethylmalonate, bistetrabutylammonium succinate, bistetrabutylammonium methylsuccinate, bistetrabutylammonium glutarate, bistetrabutylammonium adipate, bistetrabutylammonium itaconate, bistetrabutylammonium maleate, bistetrabutylammonium fumarate, bistetrabutylammonium citraconate, bistetrabutylammonium citrate, and bistetrabutylammonium carbonate.

The thermal crosslink accelerators may be used alone or in admixture of two or more. An appropriate amount of the thermal crosslink accelerator added is 0.01 to 50 parts, more preferably 0.1 to 40 parts by weight per 100 parts by weight of the base polymer, that is, the silicon-containing compound obtained by the above-described method.

To establish stability, a mono or polyfunctional organic acid of 1 to 30 carbon atoms must be added to the heat-curable silicon-containing film-forming composition as component (C). Suitable organic acids include, but are not limited to, formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, and citric acid. Of these, oxalic acid, maleic acid, formic acid, acetic acid, propionic acid, and citric acid are preferred. A mixture of two or more acids may be used to maintain the stability.

The amount of the acid added is 0.001 to 25 parts, preferably 0.01 to 15 parts, and more preferably 0.1 to 5 parts by weight per 100 parts by weight of the silicon-containing compound (A) in the composition. Alternatively, the organic acid is added in such amounts that the composition may be at a proper pH, preferably $0 \leq pH \leq 7$, more preferably $0.3 \leq pH \leq 6.5$, and even more preferably $0.5 \leq pH \leq 6$.

According to the invention, a mono or polyhydric alcohol substituted with a cyclic ether is added as a stabilizer (D) to the silicon-containing film-forming composition so that the composition is further improved in stability. Specifically suitable alcohols include ether compounds having the structure shown below.

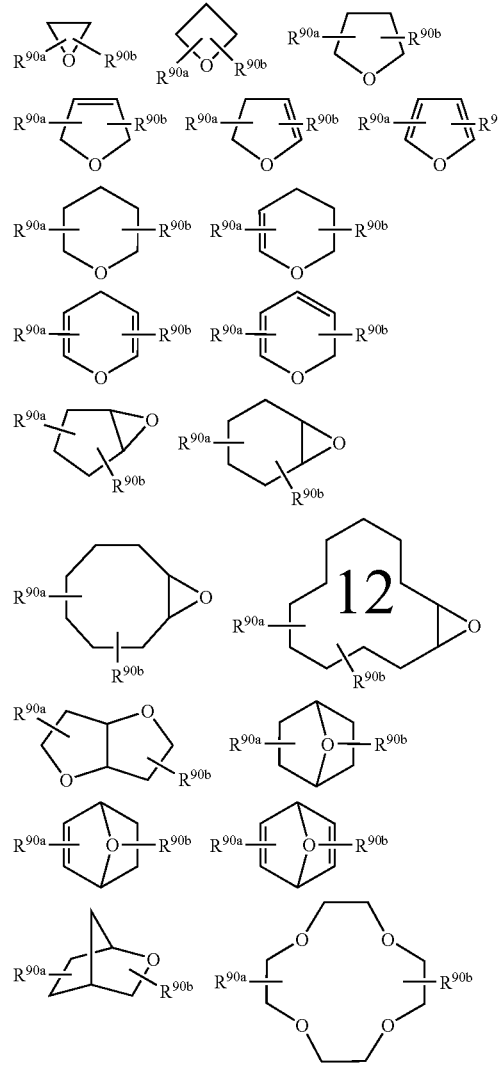

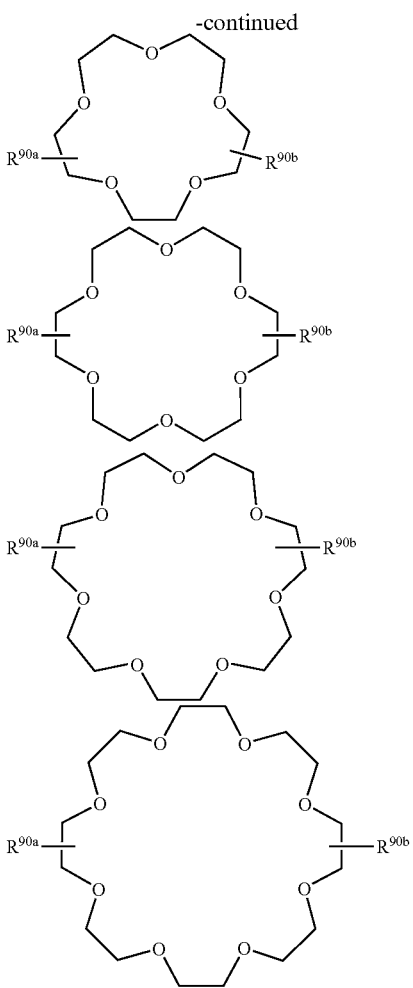

Herein $R^{90a}$ is hydrogen, a straight, branched or cyclic monovalent hydrocarbon group of 1 to 10 carbon atoms, $R^{91}O-(CH_2CH_2O)_{n1}-(CH_2)_{n2}-$ (wherein $R^{91}$ is hydrogen or methyl, $0 \leq n1 \leq 5$, $0 \leq n2 \leq 3$), or $R^{92}O-[CH(CH_3)CH_2O]_{n3}-(CH_2)_{n4}-$ (wherein $R^{92}$ is hydrogen or methyl, $0 \leq n3 \leq 5$, $0 \leq n4 \leq 3$). $R^{90b}$ is hydroxyl, a straight, branched or cyclic monovalent hydrocarbon group of 1 to 10 carbon atoms having at least one hydroxyl group, $HO-(CH_2CH_2O)_{n5}-(CH_2)_{n6}-$ (wherein $1 \leq n5 \leq 5$, $1 \leq n6 \leq 3$), or $HO-[CH(CH_3)CH_2O]_{n7}-(CH_2)_{n8}-$ (wherein $1 \leq n7 \leq 5$, $1 \leq n8 \leq 3$).

The stabilizer may be used alone or in admixture. An appropriate amount of the stabilizer added is 0.001 to 50 parts, and preferably 0.01 to 40 parts by weight per 100 parts by weight of the base polymer or silicon-containing compound (A). Stabilizers of the preferred structure include crown ether derivatives and compounds substituted with a bicyclo ring having an oxygen atom at the bridgehead. The addition of such a stabilizer helps to keep the electric charge of acid more stable, contributing to further stabilization of the silicon-containing compound in the composition.

In the composition comprising the silicon-containing compound according to the invention, an organic solvent is present as component (E). It may be the same as used in the preparation of the silicon-containing compound. Water-soluble organic solvents are preferred. Examples of the solvent used include monoalkyl ethers of ethylene glycol, diethylene glycol, triethylene glycol, etc. and monoalkyl ethers of propylene glycol, dipropylene glycol, butane diol, pentane diol, etc. The organic solvent is preferably selected from among butane diol monomethyl ether, propylene glycol monomethyl ether, ethylene glycol monomethyl ether, butane diol monoethyl ether, propylene glycol monoethyl ether, ethylene glycol monoethyl ether, butane diol monopropyl ether, propylene glycol monopropyl ether, and ethylene glycol monopropyl ether.

To the inventive composition, water may be added. The addition of water causes the silicon-containing compound to be hydrated, ameliorating the lithography performance. The content of water is preferably from more than 0% to less than 50%, more preferably from 0.3% to 30%, even more preferably 0.5% to 20% by weight, based on the solvent component in the composition. Too high a water content may adversely affect the uniformity of a coated film and at the worst, cause cissing whereas too low a water content may undesirably detract from lithography performance.

The total amount of solvents including water is preferably 500 to 100,000 parts, more preferably 400 to 50,000 parts by weight per 100 parts by weight of the base polymer.

In the composition, a photoacid generator may be used. Examples of the photoacid generator which can be used herein include:
(A-i) onium salts of the formula (P1a-1), (P1a-2) or (P1b),
(A-ii) diazomethane derivatives of the formula (P2),
(A-iii) glyoxime derivatives of the formula (P3),
(A-iv) bissulfone derivatives of the formula (P4),
(A-v) sulfonic acid esters of N-hydroxyimide compounds of the formula (P5),
(A-vi) β-ketosulfonic acid derivatives,
(A-vii) disulfone derivatives,
(A-viii) nitrobenzylsulfonate derivatives, and
(A-ix) sulfonate derivatives.

These photoacid generators are described in detail.
(i) Onium Salts of Formula (P1a-1), (P1a-2) or (P1b):

(P1a-1)

(P1a-2)

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are alkylene groups of 1 to 6 carbon atoms when they form a ring. K⁻ is a non-nucleophilic counter ion.

$R^{101a}$, $R^{101b}$, and $R^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by $K^-$ include fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzenesulfonate, and alkylsulfonate ions such as mesylate and butanesulfonate.

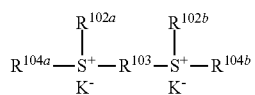

(P1b)

Herein, $R^{102a}$ and $R^{102b}$ independently represent straight, branched or cyclic alkyl groups of 1 to 8 carbon atoms. $R^{103}$ represents a straight, branched or cyclic alkylene group of 1 to 10 carbon atoms. $R^{104a}$ and $R^{104b}$ independently represent 2-oxoalkyl groups of 3 to 7 carbon atoms. $K^-$ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by $K^-$ are the same as exemplified for formulae (P1a-1), (P1a-2) and (P1a-3).

(ii) Diazomethane Derivatives of Formula (P2)

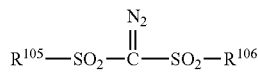

(P2)

Herein, $R^{105}$ and $R^{106}$ independently represent straight, branched or cyclic alkyl or halogenated alkyl groups of 1 to 12 carbon atoms, substituted or unsubstituted aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

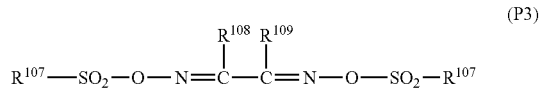

(P3)

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{105}$ and $R^{109}$, taken together, may form a ring. $R^{108}$ and $R^{109}$ each are straight or branched alkylene groups of 1 to 6 carbon atoms when they form a ring.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{105}$ and $R^{109}$ include methylene, ethylene, propylene, butylene, and hexylene.

(iv) Bissulfone Derivatives of Formula (P4)

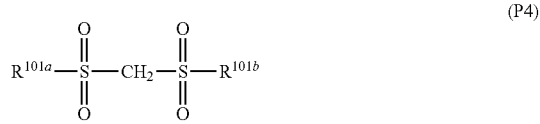

(P4)

Herein, $R^{101a}$ and $R^{101b}$ are as defined above.

(v) Sulfonic Acid Esters of N-hydroxyimide Compounds of Formula (P5)

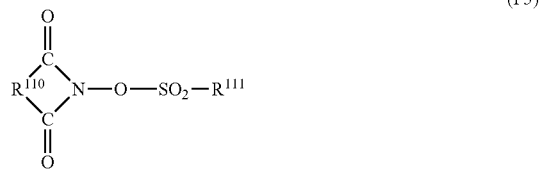

(P5)

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), heteroaromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101o}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; and the alkoxy groups of 1 to 4 carbon atoms include methoxy, ethoxy, propoxy, isopropoxy, n-butoxy, isobutoxy, and tert-butoxy. The phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl. The hetero-aromatic groups of 3 to 5 carbon atoms include pyridyl and furyl.

Illustrative examples of the photoacid generator include:
onium salts such as
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethanesulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate,
trinaphthylsulfonium trifluoromethanesulfonate,
cyclohexylmethyl(2-oxocyclohexyl)sulfonium trifluoromethanesulfonate,
(2-norbornyl)methyl(2-oxocyclohexyl)sulfonium trifluoromethanesulfonate,
ethylenebis[methyl(2-oxocyclopentyl)sulfonium trifluoromethanesulfonate], and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane;
glyoxime derivatives such as
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime;
bissulfone derivatives such as
bisnaphthylsulfonylmethane, bistrifluoromethylsulfonylmethane,
bismethylsulfonylmethane, bisethylsulfonylmethane,
bispropylsulfonylmethane, bisisopropylsulfonylmethane,
bis-p-toluenesulfonylmethane, and bisbenzenesulfonylmethane;
β-ketosulfonic acid derivatives such as
2-cyclohexylcarbonyl-2-(p-toluenesulfonyl)propane and
2-isopropylcarbonyl-2-(p-toluenesulfonyl)propane;
disulfone derivatives such as diphenyl disulfone and dicyclohexyl disulfone:
nitrobenzyl sulfonate derivatives such as
2,6-dinitrobenzyl p-toluenesulfonate and
2,4-dinitrobenzyl p-toluenesulfonate;
sulfonic acid ester derivatives such as
1,2,3-tris(methanesulfonyloxy)benzene, 1,2,3-tris(trifluoromethanesulfonyloxy)benzene, and
1,2,3-tris(p-toluenesulfonyloxy)benzene; and
sulfonic acid esters of N-hydroxyimides such as
N-hydroxysuccinimide methanesulfonate,
N-hydroxysuccinimide trifluoromethanesulfonate,
N-hydroxysuccinimide ethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide 1-octanesulfonate,
N-hydroxysuccinimide p-toluenesulfonate,
N-hydroxysuccinimide p-methoxybenzenesulfonate,
N-hydroxysuccinimide 2-chloroethanesulfonate,
N-hydroxysuccinimide benzenesulfonate,
N-hydroxysuccinimide 2,4,6-trimethylbenzenesulfonate,
N-hydroxysuccinimide 1-naphthalenesulfonate,
N-hydroxysuccinimide 2-naphthalenesulfonate,
N-hydroxy-2-phenylsuccinimide methanesulfonate,
N-hydroxymaleimide methanesulfonate,
N-hydroxymaleimide ethanesulfonate,
N-hydroxy-2-phenylmaleimide methanesulfonate,
N-hydroxyglutarimide methanesulfonate,
N-hydroxyglutarimide benzenesulfonate,
N-hydroxyphthalimide methanesulfonate,
N-hydroxyphthalimide benzenesulfonate,
N-hydroxyphthalimide trifluoromethanesulfonate,
N-hydroxyphthalimide p-toluenesulfonate,
N-hydroxynaphthalimide methanesulfonate,
N-hydroxynaphthalimide benzenesulfonate,
N-hydroxy-5-norbornene-2,3-dicarboxyimide methanesulfonate,
N-hydroxy-5-norbornene-2,3-dicarboxyimide trifluoromethanesulfonate, and
N-hydroxy-5-norbornene-2,3-dicarboxyimide p-toluenesulfonate.

Preferred among these photoacid generators are onium salts such as triphenylsulfonium trifluoromethanesulfonate,
(p-tert-butoxyphenyl)diphenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
tris(p-tert-butoxyphenyl)sulfonium p-toluenesulfonate,
trinaphthylsulfonium trifluoromethanesulfonate,
cyclohexylmethyl(2-oxocyclohexyl)sulfonium trifluoromethanesulfonate,
(2-norbornyl)methyl(2-oxocylohexyl)sulfonium trifluoromethanesulfonate, and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(cyclohexylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane, and
bis(tert-butylsulfonyl)diazomethane;
glyoxime derivatives such as
bis-O-(p-toluenesulfonyl)-α-dimethylglyoxime and
bis-O-(n-butanesulfonyl)-α-dimethylglyoxime;
bissulfone derivatives such as bisnaphthylsulfonylmethane;
and sulfonic acid esters of N-hydroxyimide compounds such as
N-hydroxysuccinimide methanesulfonate,
N-hydroxysuccinimide trifluoromethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide p-toluenesulfonate,
N-hydroxynaphthalimide methanesulfonate, and
N-hydroxynaphthalimide benzenesulfonate.

These photoacid generators may be used singly or in combinations of two or more thereof. An appropriate amount of the photoacid generator added is 0.01 to 50 parts, and more preferably 0.05 to 40 parts by weight, per 100 parts by weight of the base polymer, that is, the silicon-containing compound (A) obtained by the above-described method.

In the composition, a surfactant may optionally be compounded. The preferred surfactants are nonionic surfactants, for example, perfluoroalkyl polyoxyethylene ethanols, fluorinated alkyl esters, perfluoroalkylamine oxides, perfluoroalkyl ethylene oxide adducts, and fluorinated organosiloxanes. They are commercially available, for example, under the trade name of Fluorad FC-430, FC-431 and FC-4430 (Sumitomo 3M Co., Ltd.), Surflon S-141, S-145, KH-10, KH-20, KH-30 and KH-40 (Asahi Glass Co., Ltd.), Unidyne DS-401, DS-403 and DS-451 (Daikin Industries Ltd.), Megaface F-8151 (Dai-Nippon Ink & Chemicals, Inc.), X-70-092 and X-70-093 (Shin-Etsu Chemical Co., Ltd.). Inter alia, Fluorad FC-4430, KH-20, KH-30, and X-70-093 are preferred.

The surfactant is added to the composition in an ordinary amount as long as the objects of the invention are not compromised, preferably in an amount of 0 to 10 parts, more preferably 0 to 5 parts by weight, per 100 parts by weight of the base polymer.

A silicon-containing film useful as an etching mask can be formed on a substrate from the silicon-containing film forming composition of the invention by spin coating or similar techniques, as is the photoresist film. After spin coating, the coating is desirably baked to evaporate off the solvent and to promote crosslinking reaction for preventing the coating from mixing with the overlying resist film. The baking step is preferably effected at a temperature of 50 to 500° C. for a time of 10 to 300 seconds. While the preferred temperature range varies depending on the structure of a device to be manufactured, it is typically equal to or lower than 400° C. in order to minimize thermal damage to the device.

According to the invention, a pattern can be formed by forming a silicon-containing film, as described above, on a processable portion of a processable substrate via an intervening undercoat film, and forming a photoresist film on the silicon-containing film. The processable portion of a processable substrate may be a low-dielectric constant insulating film having a k value of up to 3, a primarily processed low-dielectric constant insulating film, a nitrogen and/or oxygen-containing inorganic film, a metal film or the like.

More specifically, the processable substrate (i.e., substrate to be processed or patterned) may be a processable layer or portion formed on a base substrate. The base substrate is not particularly limited and may be made of any material which is selected from Si, amorphous silicon (α-Si), polycrystalline silicon (p-Si), $SiO_2$, SiN, SiON, W, TiN, Al, etc, but different from the processable layer. The processable layer may be any of films of Si, $SiO_2$, SiN, SiON, p-Si, α-Si, W, W—Si, Al, Cu, Al—Si, etc., and various low dielectric films and etching stop films thereof and generally has a thickness of 50 to 10,000 nm, preferably 100 to 5,000 nm.

In a further embodiment, an antireflective coating (ARC) may be formed between the silicon-containing film and the overcoat resist film using a commercially available ARC material. Usually the ARC is formed of a compound having an aromatic substituent group. The ARC must be selected so as to impose little or no etching load to the overcoat resist film when the pattern of the overcoat resist film is transferred by dry etching. For example, if the thickness of the ARC is equal to or less than 80%, preferably equal to or less than 50% of the thickness of the overcoat resist film, the load applied during dry etching is minimized. In this embodiment, the ARC is preferably adjusted to a minimum reflectance equal to or less than 2%, more preferably equal to or less than 1%, and even more preferably equal to or less than 0.5%.

When the silicon-containing film of the invention is used in the exposure process using ArF excimer laser radiation, the overcoat resist film may be any of ordinary ArF excimer laser lithography resist compositions. There are known a number of candidates for the ArF excimer laser lithography resist composition, including resist compositions of the positive working type primarily comprising a polymer which becomes soluble in an alkaline aqueous solution as a result of decomposition of acid labile groups under the action of an acid, a photoacid generator, and a basic compound for controlling acid diffusion; and resist compositions of the negative working type primarily comprising a polymer which becomes insoluble in an alkaline aqueous solution as a result of reaction with a crosslinker under the action of an acid, a photoacid generator, a crosslinker, and a basic compound for controlling acid diffusion. Properties of a resist composition differ depending on what type of polymer is used. Well-known polymers are generally classified into poly(meth) acrylic, cycloolefin/maleic anhydride (COMA) copolymer, COMA-(meth)acrylic hybrid, ring-opening metathesis polymerization (ROMP), and polynorbornene systems. Of these, a resist composition comprising a poly(meth)acrylic polymer has superior resolution to other polymers because etching resistance is achieved by introducing an alicyclic skeleton into side chain.

There are known a number of ArF excimer laser lithography resist compositions comprising poly(meth)acrylic polymers. For the positive type, a polymer is composed of a combination of units for providing the main function of etching resistance, units which turn to be alkali soluble as a result of decomposition under the action of an acid, and units for providing adhesion, or in some cases, a combination comprising one unit capable of providing two or more of the above-mentioned functions. As the unit which changes alkali solubility under the action of an acid, (meth)acrylic acid esters having an acid labile group with an adamantane skeleton (see JP-A 9-73173) and (meth)acrylic acid esters having an acid labile group with a norbornane or tetracyclododecane skeleton (see JP-A 2003-84438) are advantageously used because they provide high resolution and etching resistance. As the unit which ensures adhesion, (meth)acrylic acid esters having a norbornane side chain with a lactone ring (see WO 00/01684), (meth)acrylic acid esters having an oxanorbornane side chain (see JP-A 2000-159758), and (meth)acrylic acid esters having a hydroxyadamantyl side chain (see JP-A 8-12626) are advantageously used because they provide satisfactory etching resistance and high resolution. Further, a polymer comprising units having as a functional group an alcohol which exhibits acidity by fluorine substitution on the vicinal carbon (see Polym. Mater. Sci. Eng., 1997, 77, pp 449) draws attention as a resist polymer complying with the immersion lithography of the current great interest because the units impart anti-swelling physical properties and hence, high resolution to the polymer. However, a decline of etching resistance due to inclusion of fluorine within the polymer is a problem. The silicon-containing film (for etching mask) of the invention is advantageously used in combination with such an organic resist material which is relatively difficult to secure etching resistance.

In the ArF excimer laser lithography resist compositions comprising the above-described polymers, acid generators, basic compounds and other components are also included. The acid generators used herein may be substantially the same as those used in the silicon-containing film forming composition of the invention, with onium salts being especially preferred for sensitivity and resolution. Also a number of basic compounds are known, and a choice may be advantageously made among the basic compounds described in JP-A 2005-146252 (US 2005/106499A1), for example.

After the silicon-containing film (for etching mask) is formed, a photoresist layer is formed thereon using a photoresist composition solution. Like the silicon-containing film (for etching mask), the photoresist composition solution is preferably applied by spin coating. Once the resist composition is spin coated, it is prebaked, preferably at 80 to 180° C. for 10 to 300 seconds. The coating is then exposed, followed by post-exposure bake (PEB) and development, yielding a resist pattern.

The silicon-containing film (for etching mask) is etched using a fluorocarbon gas, nitrogen gas, carbon dioxide gas or the like. With these gases, the silicon-containing film (for etching mask) is etched at so high an etching rate that the overcoat resist film undergoes less slimming.

In the multilayer resist process using the silicon-containing film of the invention, an undercoat film is provided between the silicon-containing film and the processable substrate. When the undercoat film is used as an etching mask for the processable substrate, the undercoat film is preferably an organic film having an aromatic framework. When the undercoat film is a sacrificial film, it may be either an organic film or a silicon-containing material having a silicon content equal to or less than 15% by weight.

It is noted that the organic film having an aromatic framework may be formed of any material selected from a number of well-known resist undercoat materials. A number of resins including 4,4'-(9H-fluoren-9-ylidene)bisphenol novolac resin with a molecular weight of 11,000 as described in JP-A 2005-128509 and other novolac resins are known as the resist undercoat film material for the bi- or trilayer resist process, and any of them can be used herein. If it is desired to enhance heat resistance beyond ordinary novolac resins, it is acceptable to incorporate polycyclic frameworks as in 4,4'-(9H-fluoren-9-ylidene)bisphenol novolac resins or to select polyimide resins (e.g., JP-A 2004-153125).

In the multilayer resist process using as the undercoat film an organic film which can serve as an etching mask for the processable substrate, the organic film is used in a process involving transferring the resist pattern resulting from previous pattern formation to the silicon-containing film and transferring again the pattern of silicon-containing film to the organic film, and specifically, in the second transfer step. Then the organic film should have such characteristics that it can be etch processed under the etching conditions to which the silicon-containing film is highly resistant, but it is highly resistant to the etching conditions under which the processable substrate is etch processed.

With respect to the organic film as the undercoat film, there are known a number of films including undercoat films for the tri-layer resist process and undercoat films for the bi-layer resist process using silicon resist compositions. A number of resins including 4,4'-(9H-fluoren-9-ylidene)bisphenol novolac resin with a molecular weight of 11,000 as described in JP-A 2005-128509 and other novolac resins are known as the resist undercoat film material for the bi- or trilayer resist process, and any of them can be used herein. If it is desired to enhance heat resistance beyond ordinary novolac resins, it is possible to incorporate polycyclic skeletons as in 4,4'-(9H-fluoren-9-ylidene)bisphenol novolac resins or to select polyimide resins (e.g., JP-A 2004-153125).

The organic film can be formed on a substrate from a composition solution by spin coating or similar techniques like the photoresist composition. After the resist undercoat film is formed by spin coating or the like, it is desirably baked to evaporate off the organic solvent. The baking is preferably effected at a temperature of 80 to 300° C. for a time of 10 to 300 seconds.

Although the thickness of each film is not particularly limited and varies depending on etching conditions, the undercoat film preferably has a thickness of at least 10 nm, and more preferably from 50 nm to 50,000 nm, the silicon-containing film preferably has a thickness from 1 nm to 200 nm, and the photoresist film preferably has a thickness from 1 nm to 300 nm.

The tri-layer resist process using the silicon-containing film (for etching mask) according to the invention is described below. In the process, an organic film is first formed on a processable substrate by spin coating or similar techniques. This organic film is desired to have high etching resistance since it will serve as a mask during later etching of the processable substrate, and is also desired to be crosslinked by heat or acid after spin coating since it should be prevented from intermixing with an overlying silicon-containing film (for etching mask). On the organic film, a silicon-containing film (for etching mask) of the inventive composition and a photoresist film are formed by the above-described technique. In accordance with the standard procedure, the resist film is patternwise exposed to a light source selected for a particular resist film, for example, KrF excimer laser, ArF excimer laser or $F_2$ laser, heat treated under conditions selected for a particular resist film, and developed with a liquid developer, obtaining a resist pattern. While the resist pattern is made an etching mask, etching is carried out under dry etching conditions under which the etching rate of the silicon-containing film is dominantly high relative to the organic film, for example, dry etching with a fluorine gas plasma. When the ARC and the silicon-containing film are etch processed in this way, a pattern of the silicon-containing film is obtained without the substantial influence of pattern changes by side etching of the resist film. Then, the undercoat organic film is etched under dry etching conditions under which the etching rate of the undercoat organic film is dominantly high relative to the substrate (having the silicon-containing film pattern to which the resist pattern has been transferred as described above), for example, by reactive dry etching with an oxygen-containing gas plasma or reactive dry etching with a hydrogen/nitrogen-containing gas plasma. This etching step produces a pattern of the undercoat organic film while the resist layer as the uppermost layer is often lost at the same time. Further, while the thus patterned undercoat organic film is made an etching mask, the processable substrate is processed by dry etching, for example, fluorine dry etching or chlorine dry etching. The processable substrate can be etch processed at a high accuracy.

EXAMPLE

Synthesis Examples and Examples are given below together with Comparative Examples for further illustrating the invention although the invention is not limited thereby.

Synthesis Example 1

A 1,000-ml glass flask was charged with 200 g of methanol, 200 g of deionized water, and 1 g of 35% hydrochloric acid. A mixture of 50 g of tetraethoxysilane, 100 g of methyltrimethoxysilane, and 10 g of phenyltrimethoxysilane was added thereto at room temperature. The flask was held at room temperature for 8 hours while hydrolytic condensation took place. To the reaction mixture, 300 ml of propylene glycol monoethyl ether was added. Concentration under a reduced pressure yielded 300 g of a propylene glycol monoethyl ether solution of silicon-containing compound #1 (polymer concentration 21%). The polymer had a weight average molecular weight (Mw) of 2,000 as measured versus polystyrene standards.

Synthesis Example 2

Synthesis was carried out as in Synthesis Example 1 except that a mixture of 100 g of methyltrimethoxysilane and 20 g of phenyltrimethoxysilane was used instead of the mixture of 50 g of tetraethoxysilane, 100 g of methyltrimethoxysilane, and 10 g of phenyltrimethoxysilane in Synthesis Example 1. There was obtained 300 g of a propylene glycol monoethyl ether solution of silicon-containing compound #2 (polymer concentration 19%). The polymer had a Mw of 3,000 as measured versus polystyrene standards.

Synthesis Example 3

Synthesis was carried out as in Synthesis Example 1 except that 260 g of deionized water, 5 g of 65% nitric acid, 70 g of tetramethoxysilane, 70 g of methyltrimethoxysilane, 10 g of phenyltrimethoxysilane, and butane diol monomethyl ether were used instead of 60 g of methanol, 200 g of deionized water, 1 g of 35% hydrochloric acid, 50 g of tetraethoxysilane, 100 g of methyltrimethoxysilane, 10 g of phenyltrimethoxysilane, and propylene glycol monoethyl ether. There was obtained 300 g of a butane diol monomethyl ether solution of silicon-containing compound #3 (polymer concentration 20%). The polymer had a Mw of 2,500 as measured versus polystyrene standards.

Synthesis Example 4

A 1,000-ml glass flask was charged with 260 g of deionized water and 1 g of 35% hydrochloric acid. A mixture of 70 g of tetramethoxysilane, 25 g of methyltrimethoxysilane, 25 g of a silane compound of formula (i), shown below, and 10 g of phenyltrimethoxysilane was added thereto at room temperature. The flask was held at room temperature for 8 hours while hydrolytic condensation took place. Then the by-product methanol were distilled off under a reduced pressure. To the reaction mixture, 800 ml of ethyl acetate and 300 ml of propylene glycol monopropyl ether were added. The water layer was separated off. To the remaining organic layer, 100 ml of deionized water was added, followed by agitation, static holding and separation. This operation was repeated three times. To the remaining organic layer, 200 ml of propylene glycol monopropyl ether was added. Concentration under a reduced pressure yielded 300 g of a propylene glycol monopropyl ether solution of silicon-containing compound #4 (polymer concentration 20%). The solution was analyzed for chloride ions by ion chromatography, but no chloride ions were detected. The polymer had a Mw of 1,800 as measured versus polystyrene standards.

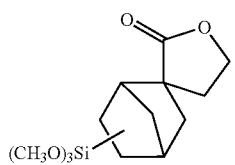

[i]

Synthesis Example 5

A 1,000-ml glass flask was charged with 200 g of ethanol, 100 g of deionized water and 3 g of methanesulfonic acid. A mixture of 40 g of tetramethoxysilane, 10 g of methyltrimethoxysilane, 50 g of a silane compound of formula (ii), shown below, and 10 g of phenyltrimethoxysilane was added thereto at room temperature. The flask was held at room temperature for 8 hours while hydrolytic condensation took place. Then the by-product methanol were distilled off under a reduced pressure. To the reaction mixture, 800 ml of ethyl acetate and 300 ml of ethylene glycol monopropyl ether were added. The water layer was separated off. To the remaining organic layer, 100 ml of deionized water was added, followed by agitation, static holding and separation. This operation was repeated three times. To the remaining organic layer, 200 ml of ethylene glycol monopropyl ether was added. Concentration under a reduced pressure yielded 300 g of an ethylene glycol monopropyl ether solution of silicon-containing compound #5 (polymer concentration 20%). The solution was analyzed for methanesulfonate ions by ion chromatography, finding that 99% of the catalyst used in reaction had been removed. The polymer had a Mw of 2,100 as measured versus polystyrene standards.

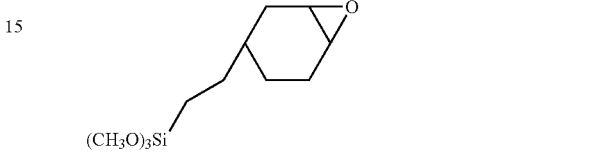

[ii]

Examples and Comparative Examples

Silicon-containing film-forming composition solutions were prepared by dissolving silicon-containing compounds (#1 to #5), acid, thermal crosslink accelerator, and additive in a solvent according to the formulation shown in Table 1, and passing through a fluoroplastic filter having a pore size of 0.1 μm. These solutions are designated Sol. 1 to 10.

TABLE 1

| | | Si-containing film-forming composition | | | | | |
|---|---|---|---|---|---|---|---|
| | No. | Si-containing compound (pbw) | Thermal crosslink accelerator (pbw) | Acid (pbw) | Solvent (pbw) | Water/ stabilizer (pbw) | Other additive (pbw) |
| Example | | | | | | | |
| 1 | Sol. 1 | #1 (4.0) | TPSOAc (0.04) | maleic acid (0.04) | propylene glycol monoethyl ether (100) | water (10) Stabilizer 1 (5) | — |
| 2 | Sol. 2 | #2 (4.0) | TPSOH (0.04) | oxalic acid (0.02) | propylene glycol monoethyl ether (100) | water (5) Stabilizer 2 (5) | — |
| 3 | Sol. 3 | #3 (4.0) | TPSCl (0.04) TMAOAc (0.003) | maleic acid (0.01) | butane diol monomethyl ether (100) | water (5) Stabilizer 3 (5) | — |
| 4 | Sol. 4 | #4 (4.0) | TPSMA (0.04) TMAOAc (0.003) | maleic acid (0.01) oxalic acid (0.01) | propylene glycol monopropyl ether (100) | water (5) Stabilizer 4 (5) | — |
| 5 | Sol. 5 | #5 (4.0) | TPSN (0.04) | maleic acid (0.01) oxalic acid (0.01) | ethylene glycol monopropyl ether (100) | water (5) Stabilizer 5 (5) | — |
| 6 | Sol. 6 | #1 (4.0) | TPSMA (0.04) | maleic acid (0.01) | propylene glycol monoethyl ether (100) | water (3) Stabilizer 1 (5) | TPSNf (0.02) |
| 7 | Sol. 7 | #1 (4.0) | TPSOAc (0.04) | maleic acid (0.01) | propylene glycol monoethyl ether (100) | water (0) Stabilizer 1 (5) | — |

TABLE 1-continued

| | | Si-containing film-forming composition | | | | | |
|---|---|---|---|---|---|---|---|
| | No. | Si-containing compound (pbw) | Thermal crosslink accelerator (pbw) | Acid (pbw) | Solvent (pbw) | Water/ stabilizer (pbw) | Other additive (pbw) |
| Comparative Example | | | | | | | |
| 1 | Sol. 8 | #1 (4.0) | TPSOAc (0.04) | — | propylene glycol monoethyl ether (100) | water (5) Stabilizer 1 (5) | — |
| 2 | Sol. 9 | #1 (4.0) | — | maleic acid (0.01) | propylene glycol monoethyl ether (100) | water (5) Stabilizer 1 (5) | — |
| 3 | Sol. 10 | #1 (4.0) | TPSOAc (0.04) | maleic acid (0.01) | propylene glycol monopropyl ether (100) | water (5) Stabilizer 1 (0) | — |

TPSOAc: triphenylsulfonium acetate (photo-degradable thermal crosslink accelerator)
TPSOH: triphenylsulfonium hydroxide (photo-degradable thermal crosslink accelerator)
TPSCl: triphenylsulfonium chloride (photo-degradable thermal crosslink accelerator)
TPSMA: mono(triphenylsulfonium) maleate (photo-degradable thermal crosslink accelerator)
TPSN: triphenylsulfonium nitrate (photo-degradable thermal crosslink accelerator)
TMAOAc: tetramethylammonium acetate (non-photo-degradable thermal crosslink accelerator)
TPSNf: triphenylsulfonium nonafluorobutanesulfonate (photoacid generator)

Stabilizer 1:

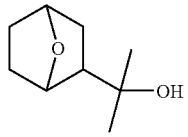

Stabilizer 2:

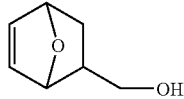

Stabilizer 3:

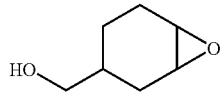

Stabilizer 4:

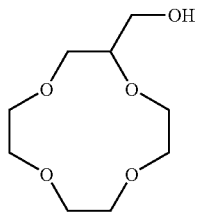 [SMILES: OCC1COCCOCCOCCO1]

Stabilizer 5:

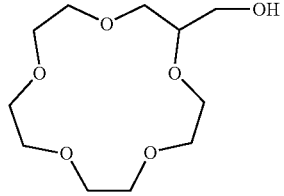 [SMILES: OCC1COCCOCCOCCOCCO1]

First, an undercoat-forming material, specifically a composition containing 28 parts by weight of a 4,4'-(9H-fluoren-9-ylidene)bisphenol novolac resin with a molecular weight of 11,000 and 100 parts by weight of a solvent (see JP-A 2005-128509) was spin coated onto a silicon wafer and baked at 200° C. for one minute to form an undercoat organic film of 300 nm thick. While a number of resins including the above-specified resin and other novolac resins are known as the undercoat organic film material for the multilayer resist process, any of them can be used herein.

Next, each of the silicon-containing film forming solutions (Sol. 1 to 10) was spin coated and baked at 200° C. for 1 minute to form an Si-containing film of 100 nm thick.

Further, to form an overcoat resist film, a resist composition for ArF excimer laser lithography (designated Resist 1) was prepared by dissolving 10 parts by weight of a resin, identified below, 0.2 part by weight of triphenylsulfonium nonafluorobutanesulfonate as a photoacid generator and 0.02 part by weight of triethanolamine as a basic compound in propylene glycol monomethyl ether acetate (PGMEA) containing 0.1 wt % of Fluorad FC-430 (3M-Sumitomo Co., Ltd.) and passing through a fluoroplastic filter having a pore size of 0.1 μm.

Resin:

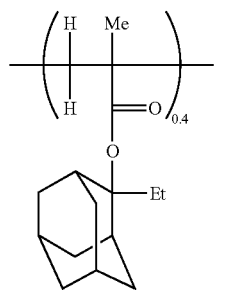 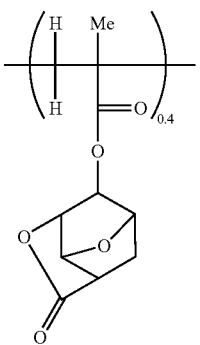

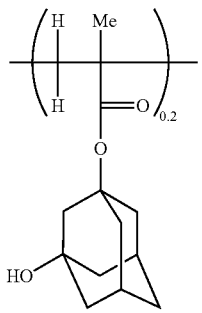

Mw = 6,800
(Me = methyl, Et = ethyl)

The resist composition was coated onto the Si-containing intermediate film and baked at 130° C. for 60 seconds to form a photoresist layer of 200 nm thick.

Thereafter, the resist layer was exposed using an ArF laser stepper S305B (Nikon Corporation, NA 0.68, σ0.85, ⅔ annular illumination, Cr mask), then baked (PEB) at 110° C. for 90 seconds, and developed with a 2.38 wt % aqueous solution of tetramethylammonium hydroxide (TMAH), thereby giving a positive pattern. The profile of the 90 nm line-and-space pattern was observed, with the results shown in Table 2.

TABLE 2

| | | Pattern profile | |
|---|---|---|---|
| | | No. | Pattern profile |
| Example | 1 | Sol. 1 | good |
| | 2 | Sol. 2 | good |
| | 3 | Sol. 3 | good |
| | 4 | Sol. 4 | good |
| | 5 | Sol. 5 | good |
| | 6 | Sol. 6 | good |
| | 7 | Sol. 7 | good |
| Comparative Example | 1 | Sol. 8 | footing |
| | 2 | Sol. 9 | negative profile |
| | 3 | Sol. 10 | good |

In all Examples, the patterns were found to be free of substrate-proximate footing, undercut and intermixing phenomena.

Next, dry etching resistance was tested. Each of the silicon-containing film forming solutions (Sol. 1 to 10) was spin coated and baked at 200° C. for 1 minute to form an Si-containing film of 100 nm thick (Film 1 to 10). An etching test was performed on these films, the undercoat film, and the photoresist film under the following set of etching conditions (1). The results are shown in Table 3.

| (1) $CHF_3/CF_4$ gas etching test | |
|---|---|
| Instrument: | dry etching instrument TE-8500P by Tokyo Electron Ltd. |
| Chamber pressure: | 40.0 Pa |
| RF power: | 1,300 W |
| Gap: | 9 mm |
| $CHF_3$ gas flow rate: | 30 ml/mm |
| $CF_4$ gas flow rate: | 30 ml/mm |
| Ar gas flow rate: | 100 ml/mm |
| Treating time: | 10 sec |

TABLE 3

| | | | | $CHF_3/CF_4$ gas dry etching rate | |
|---|---|---|---|---|---|
| | | | Si-containing film-forming composition | Si-containing film | $CHF_3/CF_4$ gas dry etching rate (nm/min) |
| Example | | 1 | Sol. 1 | Film 1 | 400 |
| | | 2 | Sol. 2 | Film 2 | 500 |
| | | 3 | Sol. 3 | Film 3 | 450 |
| | | 4 | Sol. 4 | Film 4 | 250 |
| | | 5 | Sol. 5 | Film 5 | 200 |
| | | 6 | Sol. 6 | Film 6 | 500 |
| | | 7 | Sol. 7 | Film 7 | 400 |
| Comparative Example | | 1 | Sol. 8 | Film 8 | 400 |
| | | 2 | Sol. 9 | Film 9 | 400 |
| | | 3 | Sol. 10 | Film 10 | 400 |
| Resist film | | | — | — | 120 |
| Undercoat film | | | — | — | 85 |

Separately, a rate of $O_2$ gas dry etching was examined under the following set of etching conditions (2). The results are shown in Table 4.

| (2) $O_2$ gas etching test | |
|---|---|
| Chamber pressure: | 60.0 Pa |
| RF power: | 600 W |
| Ar gas flow rate: | 40 ml/min |
| $O_2$ gas flow rate: | 60 ml/min |
| Gap: | 9 mm |
| Treating time: | 20 sec |

TABLE 4

| | | | $O_2$ gas dry etching rate | |
|---|---|---|---|---|
| | | | Si-containing film | $O_2$ gas etching rate (nm/min) |
| Example | | 1 | Flim 1 | 2 |
| | | 2 | Film 2 | 1 |
| | | 3 | Film 3 | 2 |
| | | 4 | Film 4 | 10 |
| | | 5 | Film 5 | 15 |
| | | 6 | Film 6 | 2 |
| | | 7 | Film 7 | 2 |

TABLE 4-continued

O₂ gas dry etching rate

| | | Si-containing film | O₂ gas etching rate (nm/min) |
|---|---|---|---|
| Comparative | 1 | Film 8 | 2 |
| Example | 2 | Film 9 | 2 |
| | 3 | Film 10 | 2 |
| Resist film | | — | 250 |
| Undercoat film | | — | 210 |

It is seen that as compared with the undercoat film and the overcoat resist film, the silicon-containing intermediate films have a low etching rate sufficient to use them as an etching mask in transferring the pattern to the underlying layer.

Furthermore, a shelf stability test was performed. The silicon-containing film forming compositions (Sol. 1 to 10) prepared above were stored at 30° C. for 3 months, following which they were coated by the above-mentioned technique. It was examined whether any change of film formation occurred before and after the storage. The results are shown in Table 5.

TABLE 5

Shelf stability test

| | | Composition | State as coated |
|---|---|---|---|
| Example | 1 | Sol. 1 | no thickness change, no pattern profile change |
| | 2 | Sol. 2 | no thickness change, no pattern profile change |
| | 3 | Sol. 3 | no thickness change, no pattern profile change |
| | 4 | Sol. 4 | no thickness change, no pattern profile change |
| | 5 | Sol. 5 | no thickness change, no pattern profile change |
| | 6 | Sol. 6 | no thickness change, no pattern profile change |
| | 7 | Sol. 7 | no thickness change, no pattern profile change |
| Comparative | 1 | Sol. 8 | 5% thickness increase, pattern stripped |
| Example | 2 | Sol. 9 | no thickness change, pattern stripped |
| | 3 | Sol. 10 | 15% thickness increase, pattern stripped |

It is seen from Table 5 that all the compositions of Examples remain stable at 30° C. over 3 months, corresponding to shelf stability at room temperature over 6 months.

The composition of the invention and the silicon-containing film thereof are improved in stability and lithographic characteristics. The inventive composition enables pattern formation using the state-of-the-art high-NA exposure system and substrate processing by etching.

Japanese Patent Application Nos. 2007-175956 and 2007-245832 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A heat curable silicon-containing film-forming composition comprising
   (A) a silicon-containing compound obtained through hydrolytic condensation of a hydrolyzable silicon compound in the presence of an acid catalyst,
   (B) at least one compound having the general formula (1) or (2):

$$L_aH_bX \quad (1)$$

wherein L is lithium, sodium, potassium, rubidium or cesium, X is a hydroxyl group or a mono or polyfunctional organic acid residue of 1 to 30 carbon atoms, "a" is an integer of at least 1, "b" is 0 or an integer of at least 1, and a+b is equal to the valence of hydroxyl group or organic acid residue, $$M_aH_bA \quad (2)$$

wherein M is sulfonium, iodonium or ammonium, A is X or a non-nucleophilic counter ion, "a" and "b" are as defined above, and a+b is equal to the valence of hydroxyl group, organic acid residue or non-nucleophilic counter ion,
   (C) a mono or polyfunctional organic acid of 1 to 30 carbon atoms,
   (D) a mono or polyhydric alcohol substituted with a cyclic ether, and
   (E) an organic solvent.

2. The silicon-containing film-forming composition of claim 1, wherein the silicon-containing compound (A) comprises a silicon-containing compound obtained by effecting hydrolytic condensation of a hydrolyzable silicon compound in the presence of an acid catalyst which is selected from mineral acids, sulfonic acid derivatives and mixtures thereof to form a reaction mixture containing the silicon-containing compound, and substantially removing the acid catalyst from the reaction mixture.

3. The silicon-containing film-forming composition of claim 1, wherein M in formula (2) is tertiary sulfonium, secondary iodonium, or quaternary ammonium.

4. The silicon-containing film-forming composition of claim 1, wherein M in formula (2) is photo-degradable.

5. The silicon-containing film-forming composition of claim 1, further comprising water.

6. The silicon-containing film-forming composition of claim 1, further comprising a photoacid generator.

7. A multilayer resist process comprising the steps of:
   forming an organic film on a processable substrate,
   forming a silicon-containing film thereon,
   forming a resist film thereon from a silicon-free chemically amplified resist composition,
   patterning the resist film,
   patterning the silicon-containing film using the resist film pattern,
   patterning the underlying organic film with the silicon-containing film pattern serving as an etching mask, and
   etching the processable substrate with the patterned organic film made an etching mask,
   wherein the silicon-containing film is formed from a composition comprising:
   (A) a silicon-containing compound obtained through hydrolytic condensation of a hydrolyzable silicon compound in the presence of an acid catalyst,
   (B) at least one compound having the general formula (1) or (2):

$$L_aH_bX \quad (1)$$

wherein L is lithium, sodium, potassium, rubidium or cesium, X is a hydroxyl group or a mono or polyfunctional organic acid residue of 1 to 30 carbon atoms, "a" is an integer of at least 1, "b" is 0 or an integer of at least 1, and a+b is equal to the valence of hydroxyl group or organic acid residue, $$M_aH_bA \quad (2)$$

wherein M is sulfonium, iodonium or ammonium, A is X or a non-nucleophilic counter ion, "a" and "b" are as defined above, and a+b is equal to the valence of hydroxyl group, organic acid residue or non-nucleophilic counter ion, (C) a mono or polyfunctional organic acid of 1 to 30 carbon atoms, (D) a mono or polyhydric alcohol substituted with a cyclic ether, and (E) an organic solvent.

8. The multilayer resist process of claim 7, wherein the process further includes the step of disposing an organic antireflective coating between the resist film and the silicon-containing film.

9. A substrate having formed thereon, in sequence, an organic film, a silicon-containing film-forming composition, and a photoresist film, wherein the silicon-containing film-forming composition comprises:

(A) a silicon-containing compound obtained through hydrolytic condensation of a hydrolyzable silicon-compound in the presence of an acid catalyst, (B) at least one compound having the general formula (1) or (2):

$$L_aH_bX \tag{1}$$

wherein L is lithium, sodium, potassium, rubidium or cesium, X is a hydroxyl group or a mono or polyfunctional organic acid residue of 1 to 30 carbon atoms, "a" is an integer of at least 1, "b" is 0 or an integer of at least 1, and a+b is equal to the valence of hydroxyl group or organic acid residue,

$$M_aH_bA \tag{2}$$

wherein M is sulfonium, iodonium or ammonium, A is X or a non-nucleophilic counter ion, "a" and "b" are as defined above, and a+b is equal to the valence of hydroxyl group, organic acid residue or non-nucleophilic counter ion, (C) a mono or polyfunctional organic acid of 1 to 30 carbon atoms, (D) a mono or polyhydric alcohol substituted with a cyclic ether, and (E) an organic solvent.

10. The substrate of claim 9, wherein said organic film is a film having an aromatic framework.

11. A method for forming a pattern in a substrate, comprising the steps of:

providing the substrate of claim 9, exposing a pattern circuit region of the photoresist film to radiation, developing the photoresist film with a developer to form a resist pattern, dry etching the silicon-containing film with the resist pattern made an etching mask, etching the organic film with the patterned silicon-containing film made an etching mask, and etching the substrate with the patterned organic film made an etching mask, for forming a pattern in the substrate.

12. The method of claim 11, wherein said organic film is a film having an aromatic framework.

13. The method of claim 11, wherein the exposing step is carried out by photolithography using radiation having a wavelength equal to or less than 300 nm.

14. A substrate having formed thereon, in sequence, an organic film, a silicon-containing film-forming composition, an antireflective coating, and a photoresist, wherein the silicon-containing film-forming composition comprises:

(A) a silicon-containing compound obtained through hydrolytic condensation of a hydrolyzable silicon compound in the presence of an acid catalyst, (B) at least one compound having the general formula (1) or (2):

$$L_aH_bX \tag{1}$$

wherein L is lithium, sodium, potassium, rubidium or cesium, X is a hydroxyl group or a mono or polyfunctional organic acid residue of 1 to 30 carbon atoms, "a" is an integer of at least 1, "b" is 0 or an integer of at least 1, and a+b is equal to the valence of hydroxyl group or organic acid residue,

$$M_aH_bA \tag{2}$$

wherein M is sulfonium, iodonium or ammonium, A is X or a non-nucleophilic counter ion, "a" and "b" are as defined above and a+b is equal to the valence of hydroxyl group, organic acid residue or non-nucleophilic counter ion, (C) a mono or polyfunctional organic acid of 1 to 30 carbon atoms, (D) a mono or polyhydric alcohol substituted with a cyclic ether, and (E) an organic solvent.

15. A method for forming a pattern in a substrate, comprising the steps of:

providing the substrate of claim 14, exposing a pattern circuit region of the photoresist film to radiation, developing the photoresist film with a developer to form a resist pattern, dry etching the antireflective coating and the silicon-containing film with the resist pattern made an etching mask, etching the organic film with the patterned silicon-containing film made an etching mask, and etching the substrate with the patterned organic film made an etching mask, for forming a pattern in the substrate.

* * * * *